(12) United States Patent
Finlay

(10) Patent No.: US 6,236,071 B1
(45) Date of Patent: May 22, 2001

(54) TRANSISTOR HAVING A NOVEL LAYOUT AND AN EMITTER HAVING MORE THAN ONE FEED POINT

(75) Inventor: Hugh J. Finlay, Moorpark, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 0 days.

(21) Appl. No.: 09/126,301

(22) Filed: Jul. 30, 1998

(51) Int. Cl.[7] ................ H01L 31/0328; H01L 27/082; H01L 27/102; H01L 29/70; H01L 31/11

(52) U.S. Cl. .............. 257/197; 257/571; 257/578; 257/580; 257/582; 257/586; 257/592

(58) Field of Search ................... 257/565, 571, 257/578, 580, 581, 582, 586, 592, 197, 591

(56) References Cited

U.S. PATENT DOCUMENTS 3,063,879 * 11/1962 Strull ....................... 257/578
5,939,739 * 8/1999 O'Keefe ..................... 257/197

* cited by examiner

Primary Examiner—Steven Loke
(74) Attorney, Agent, or Firm—Thomas, Kayden, Horstemeyer & Risley, L.L.P.

(57) ABSTRACT

A transistor with a novel compact layout is provided. The transistor has an emitter layout having a track with a first feed point and a second feed point whereby current flows through both the first feed point and the second feed point. A base terminal, a collector terminal, and an emitter terminal are provided. When in operation, current flows from the collector terminal to the emitter terminal based on the amount of current provided to the base terminal. A sub-collector layer is formed on a substrate. A collector layer is formed on the sub-collector layer. A base pedestal is formed on the collector layer. A base contact for coupling to the base terminal and an emitter is formed on the base pedestal. An emitter contact for coupling to the emitter terminal is formed on the emitter. A collector terminal for coupling to the collector contact is deposited in a trench that is formed in the collector layer and the sub-collector layer.

14 Claims, 44 Drawing Sheets

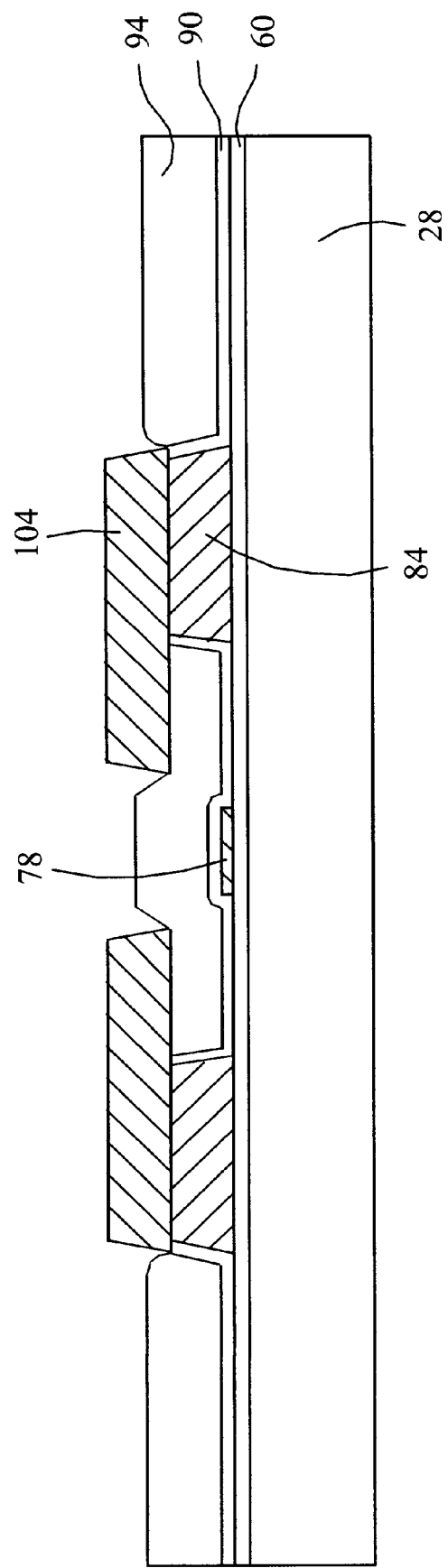

TRANSISTOR HAVING A NOVEL LAYOUT AND AN EMITTER HAVING MORE THAN ONE FEED POINT

BACKGROUND OF THE INVENTION

1. Field of the Invention

This invention relates generally to transistors, and particularly to a Heterojunction Bipolar Transistor (HBT) having a novel layout and an emitter having more than one feed point.

2. Background Art

The global wireless market is rapidly expanding as people demand products that increase the ability to communicate freely without time and place restrictions. These products includes the very popular cellular telephones that employ either analog or digital technology. Cellular telephones utilize a transmitter to transmit data to a local base-station that in turn forwards the data to another base-station or the intended party. An important component in the transmitter and in other wireless communication systems is the power amplifier. The design of power amplifiers employs power transistors. A common power transistor is the Heterojunction Bipolar Transistor (HBT).

FIG. 1 illustrates a layout of a conventional HBT 1 having a first section 2 (also referred to as an "active" area) with a collector terminal 7, a second section 3 with a base terminal 5, and a third section 4 with an emitter terminal 6. The first section 2 includes three rectangular collector contacts 10 and two rectangular base pedestals 11. Each base pedestal 11 includes a rectangular base contact 12 and a rectangular emitter 13. Emitter contacts (not shown) are deposited over the emitters 13.

A base ballast resistor 8 having a layout with two rectangular areas is coupled between a base terminal 5 and base contact 12. An emitter ballast resistor 9 having a layout with two rectangular areas includes a first end that is coupled to emitter terminal 6 and a second end that is coupled to the emitter contact.

FIG. 2 illustrates a cross sectional view of transistor 1 of FIG. 1 through line 2—2. This sectional view further illustrates that there are two separate base pedestals 11, two separate base contacts 12, two separate emitters 13, and three separate collector contacts 10 for each transistor 1. A first metal layer 14 and a second metal layer 15 are deposited and selectively etched away so as to contact portions of transistor 1, such as collector contact 10, base contact 12, and emitter 13.

Unfortunately, these conventional HBTs suffer from the following disadvantages: 1) large area; 2) susceptibility to emitter failure; and 3) poor electrical performance.

LARGE AREA

Since the area occupied by power transistors in a power amplifier is a significant portion of the total die area for a power amplifier, reducing the area of the power transistors is desirable since this can substantially reduce the total die area occupied by the power amplifier. As is well-known by those skilled in the art, a reduction of the total die area for a circuit would reduce the costs to manufacture the circuit and would also increase integration (i.e., the number of circuit elements that can be integrated into a circuit design).

However, the ability to reduce the area of circuits is hindered by heat concerns as systems migrate to lower voltages. As the voltage of the system decreases, designers are forced to make the transistors larger to accommodate a fixed power requirement (i.e., $P=VI$, where P is the power, V is the voltage, and I is the current). If V decreases, such as in a low operating voltage environment, then I must increase to keep P constant. However, an increase in I is accomplished through a larger transistor area and in particular a larger emitter area. Therefore, conventional power transistors 1 that are designed for use in low voltage systems have layouts with large area requirements in order to handle the high current levels.

Consequently, it is a challenge to design transistors that can handle the current requirements of a low operating voltage system while simultaneously maintaining or shrinking the layout area of the transistor.

SUSCEPTIBILITY TO EMITTER FAILURE

Moreover, in conventional power transistors 1, the current density in the emitters 13 is uneven. In other words, there is a low current density at a first end 13A of emitter 13 while there is a high current density at a second end 13B of emitter 13. Since a high current density exposes the second end 13B of the emitter 13 to extremely high temperatures, the transistor 1 is susceptible to failure stemming from emitter 13 failure (e.g., emitter burn-out).

POOR ELECTRICAL PERFORMANCE

Conventional power transistors 1 also suffer from a high base-to-collector capacitance that impairs electrical performance of the transistor I and thereby adversely affects any circuit that utilizes the transistor 1. In a rectangular layout, the base pedestals 11 and the collector contacts 10 are capacitively coupled causing feedback between the collector and base areas. Furthermore, since the base-to-collector capacitance is proportional to the base pedestal areas, the large base pedestal area of conventional power transistors 1 increases the base to collector capacitance, thereby decreasing performance.

Accordingly, there remains a need for a transistor that occupies less area and is suitable for low operating voltages, while maintaining performance and reliability of the transistor.

SUMMARY OF THE INVENTION

It is an object of the present invention to provide a transistor having a compact layout.

It is a further object of the present invention to provide a transistor that is suitable for low operating voltage environments while maintaining performance and reliability.

It is another object of the present invention to provide a transistor having an emitter layout that increases emitter reliability.

It is yet another object of the present invention to provide a transistor having a base pedestal layout that reduces the base-to-collector capacitance.

It is a further object of the present invention to provide a transistor having a collector contact and emitter layout that reduces the collector-to-emitter resistance.

It is another object of the present invention to provide a transistor having a layout that provides for heat shunting within a transistor cell.

It is yet another object of the present invention to provide a transistor having a layout that provides for heat shunting across adjacent transistor cells.

In order to accomplish the objects of the present invention, a transistor with a novel compact layout is provided. In a first embodiment, the novel layout includes an emitter formed within a first section of a transistor having a track with a first feed point and a second feed point whereby current flows through both the first feed point and the second feed point. The transistor includes a base terminal, a collector terminal, and an emitter terminal. When in operation, current flows from the collector terminal to the emitter terminal based on the amount of current provided to the base terminal. The transistor includes a sub-collector layer formed on a substrate. A collector layer is formed on the sub-collector layer. A base pedestal is formed on the collector layer. A base contact for coupling to the base terminal and an emitter are formed on the base pedestal. An emitter contact for coupling to the emitter terminal is formed on the emitter. A collector terminal for coupling to the collector contact is deposited in a trench that is formed in the collector layer and the sub-collector layer. A base ballast resistor is provided in the second section of the transitor, and an emitter ballast resistor is provided in the third section of the transitor.

In an alternative embodiment, the intrinsic (first) section and the third section remain essentially the same as the first embodiment. The second section features the following differences. A first dielectric disposed between an inactive region and layers formed on the first dielectric layer includes windows so that the first metal layer can contact the inactive region. Also, a second metal layer includes a portion that bridges the legs of the first metal layer. In the first section, the second metal includes a portion for substantially covering the base pedestal. The first metal layer, the second metal layer, and the window in the first dielectric are provided to shunt heat away from the emitter to the cooler inactive region. A base ballast resistor is provided in the second section, and an emitter ballast resistor is provided in the third section.

In yet another alternative embodiment, the intrinsic section and the second section remain essentially the same as the second embodiment. The second section features the following differences. The first metal layer and the second metal layer each have a portion in the second section that extends longitudinally that can be coupled to the first metal layer and the second metal layer, respectively, in a second section of an adjacent transistor cell. The third section features the following differences from the second embodiment. Although a base ballast resistor is provided in the second section, no emitter ballast resistor is provided in the third section. Also, the second metal layer extends into the third section from the second section and extends longitudinally to couple to the second metal layer in an adjacent transistor cell in the third section for further heat distribution and dissipation.

BRIEF DESCRIPTION OF THE DRAWINGS

The present invention is illustrated by way of example, and not by way of limitation, in the figures of the accompanying drawings and in which like reference numerals refer to similar elements.

FIG. 3C is a cross-sectional view of a second section of the transistor of FIG. 3A through line 3C—3C (Sec. 3C).

DETAILED DESCRIPTION OF THE INVENTION

In the following detailed specification, numerous specific details are set forth, such as layers, layouts, cross-sectional views, plan views, materials, thicknesses, dimensions, processes, etc., in order to provide a thorough understanding of the present invention. However, it will be apparent to one skilled in the art that the present invention may be practiced without some of these specific details. In certain instances, well-known processing steps, process flows, device structures, semiconductor manufacturing materials, and equipment have not been described in detail in order to avoid unnecessarily obscuring the present invention.

The present invention is described with respect to three exemplary embodiments: (1) a transistor cell having a novel and compact layout without heat shunting; (2) a heat shunting transistor cell that includes an emitter ballast resistor; and (3) a heat shunting transistor cell that does not include an emitter ballast resistor.

A novel aspect common to all three embodiments is the compact layout of the intrinsic transistor. The novel compact layout of the intrinsic transistor includes the following novel aspects among others: (1) an emitter that includes more than one feed point where current can be drawn from the emitter;

(2) a single, integral base pedestal having a layout that supports the emitter current density while reducing the capacitance between the collector and the base pedestal; and (3) a collector contact layout that in conjunction with the emitter layout reduces the collector-to-emitter resistance by causing current to flow radially from the collector to the emitter.

A TRANSISTOR HAVING A NOVEL AND COMPACT LAYOUT WITHOUT HEAT SHUNTING

Figure 3A:
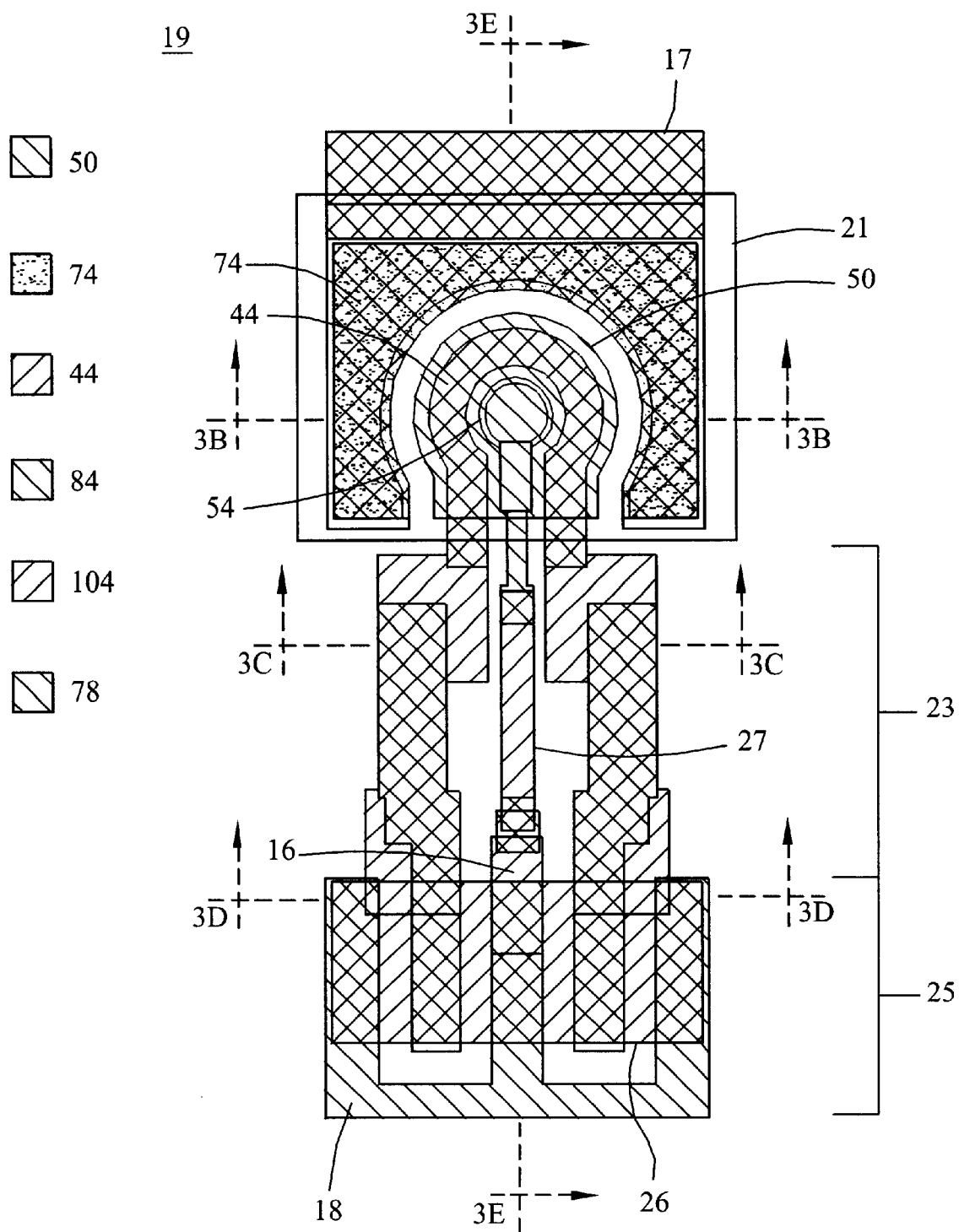
FIG. 3A is a top view of a layout of a transistor configured in accordance with a first embodiment of the present invention.

FIG. 3A is a layout of a transistor cell 19 (also referred to hereinafter as "transistor") configured in accordance with a first embodiment of the present invention. The layout of transistor cell 19 includes a first section 21 (also referred to hereinafter as "intrinsic transistor section"), a second section 23 (also referred to hereinafter as "base ballast resistor section"), and a third section 25 (also referred to hereinafter as "emitter ballast resistor section").

Figure 3B:
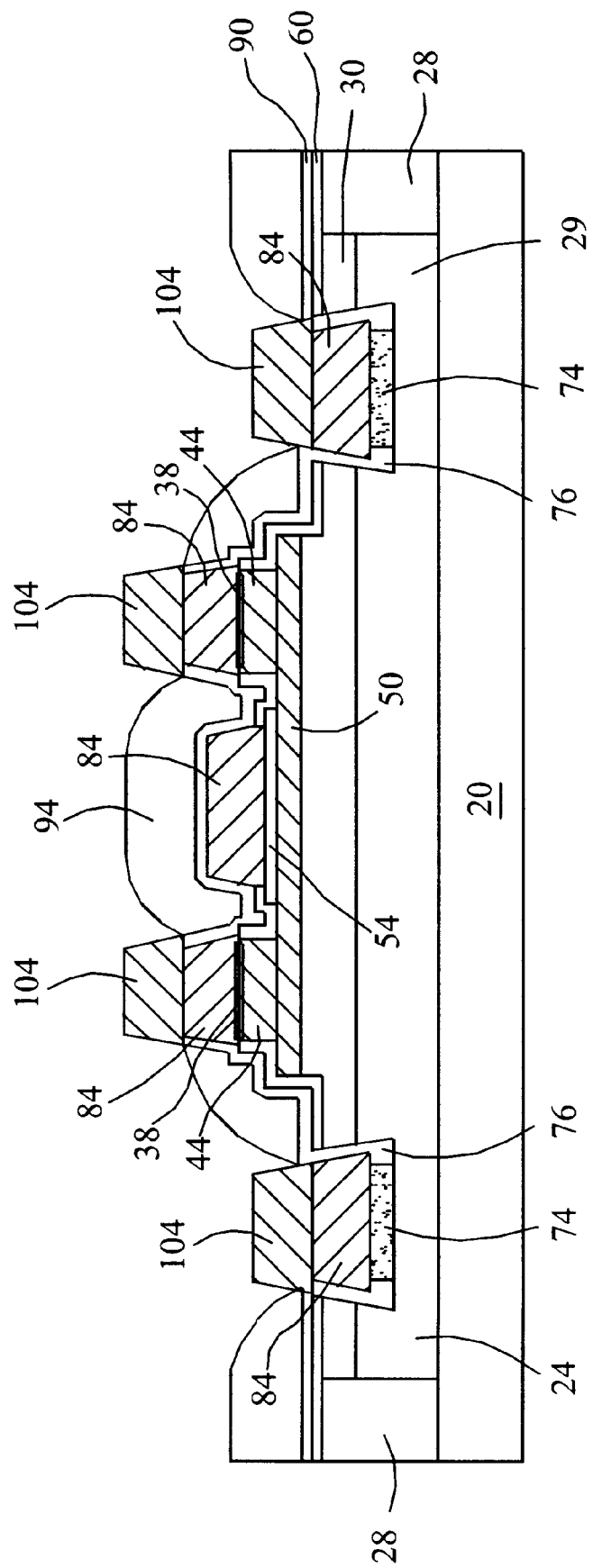
FIG. 3B is a cross-sectional view of a first section of the transistor of FIG. 3A through line 3B—3B (Sec. 3B).
Figure 3D:
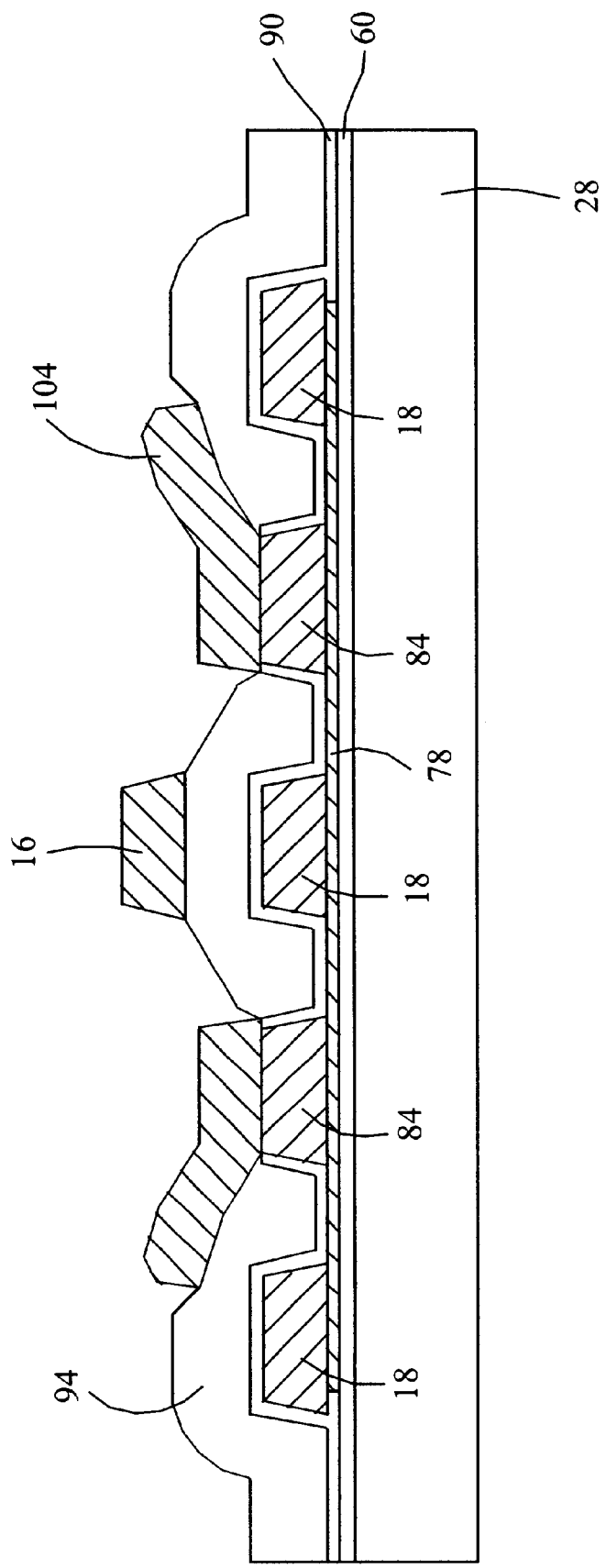
FIG. 3D is a cross-sectional view of a third section of the transistor of FIG. 3A through line 3D—3D (Sec. 3D).
Figure 3E:
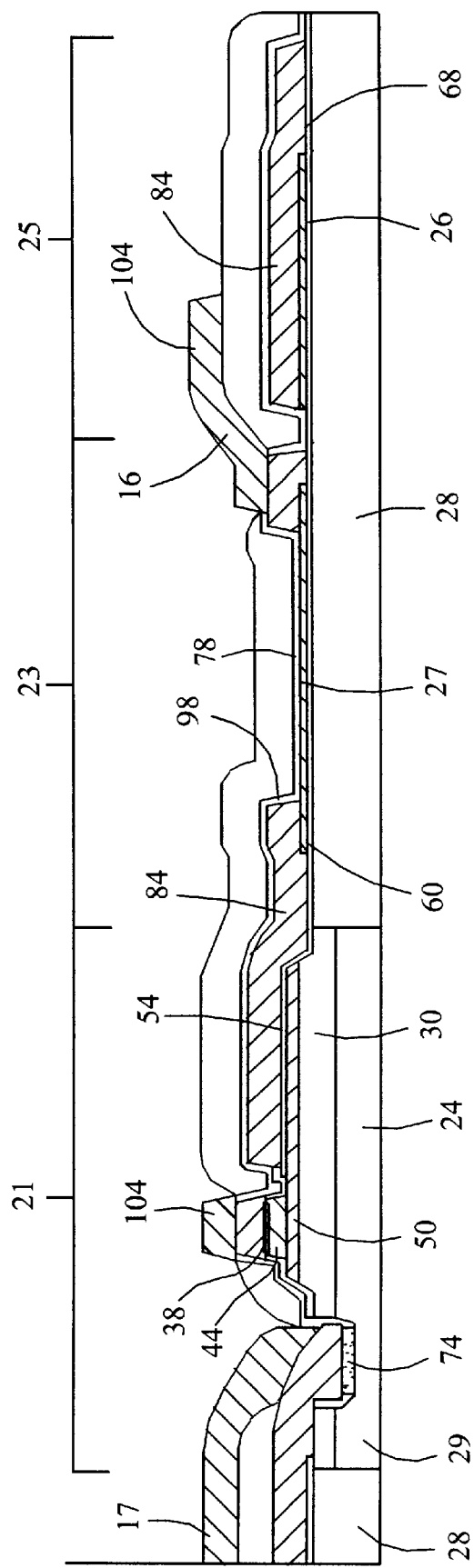
FIG. 3E is a cross-sectional view of the transistor of FIG. 3A through line 3E—3E (Sec. 3E).
Figure 3F:
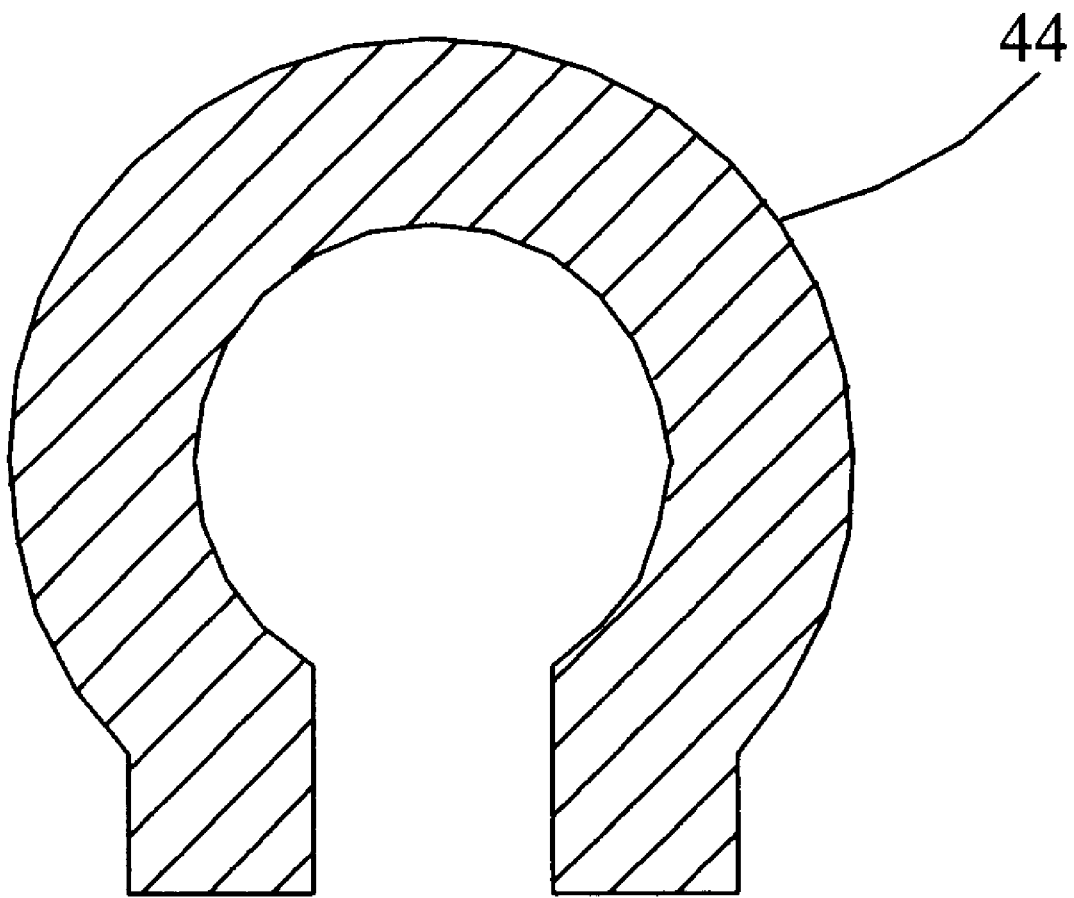
FIGS. 3F–3P are top views of selected layers in the transistor of FIG. 3A.
Figure 3G:
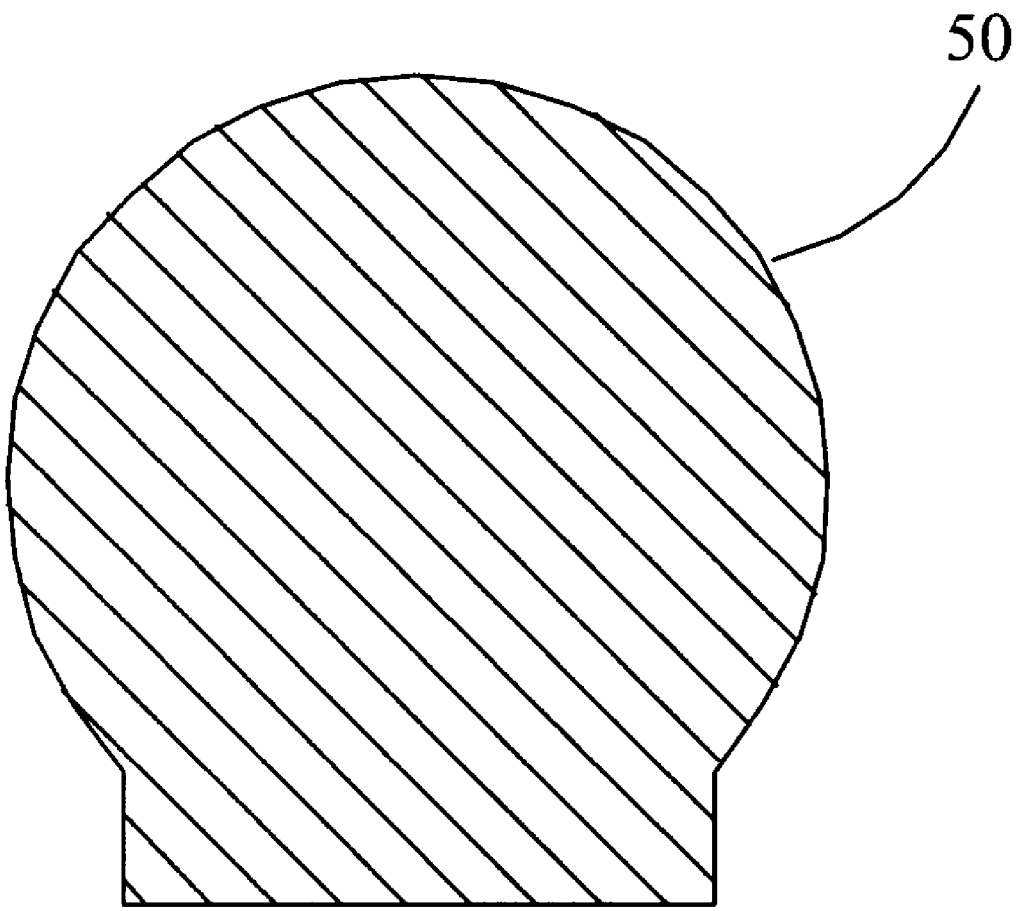

First section 21 includes a collector contact 74 (shown more clearly in FIGS. 3B, 3E, and 3K) for coupling a sub-collector layer 29 to a collector terminal 17 (shown also in FIG. 3E). A generally circular base pedestal 50 (which is described in greater detail hereinafter with reference to FIGS. 3B, 3E, and 3G) is formed from a base layer and a portion of a collector layer 30. A base contact 54 (which is described in greater detail hereinafter with reference to FIGS. 3B, 3E, and 3I) for coupling to a base terminal 16 and a ring shaped emitter 44 (which is described in greater detail hereinafter with reference to FIGS. 3B, 3E, and 3F) are disposed on base pedestal 50. An emitter contact 38 (which is described in greater detail hereinafter with reference to FIGS. 3B and 3E) for coupling to an emitter terminal 18 is disposed on emitter 44.

Second section 23 includes a base ballast resistor 27 for controlling gain in transistor 19 and for maintaining RF stability. Base ballast resistor 27 is formed from resistive material 80 (shown in FIG. 3M). Third section 25 includes an emitter ballast resistor 26 for ensuring an equal distribution of current in the transistor cell 19. Emitter ballast resistor 26 is formed from resistive material 82 (shown in FIG. 3M). Emitter ballast resistor 26 is preferred for higher voltage (e.g., 5V to 10V) applications where emitter resistor 26 can be used to evenly distribute current in transistor cell 19.

Third section 25 further includes emitter terminal 18 and base terminal 16. Base ballast resistor 27 of second section 23 can have a resistance that depends on the particular application and preferably is in the range of 0 to 400 ohms. Emitter ballast resistor 26 has a relatively low resistance that depends on the particular application and preferably is in the range of 0 to 5 ohms.

Figure 3H:
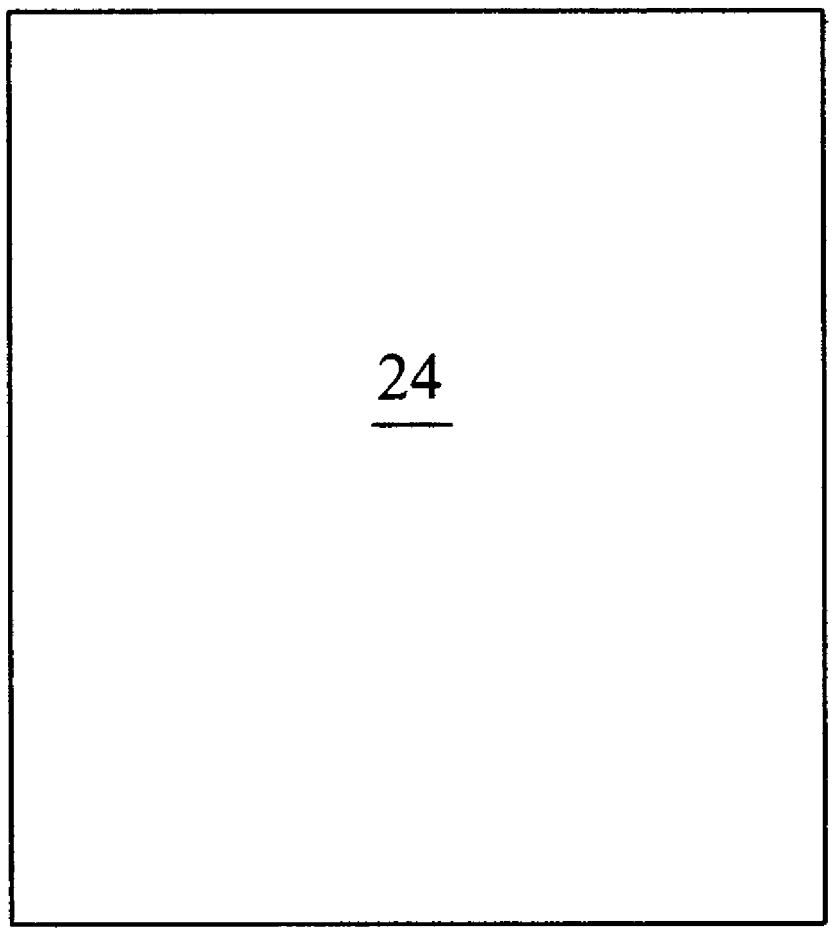
Figure 3I:
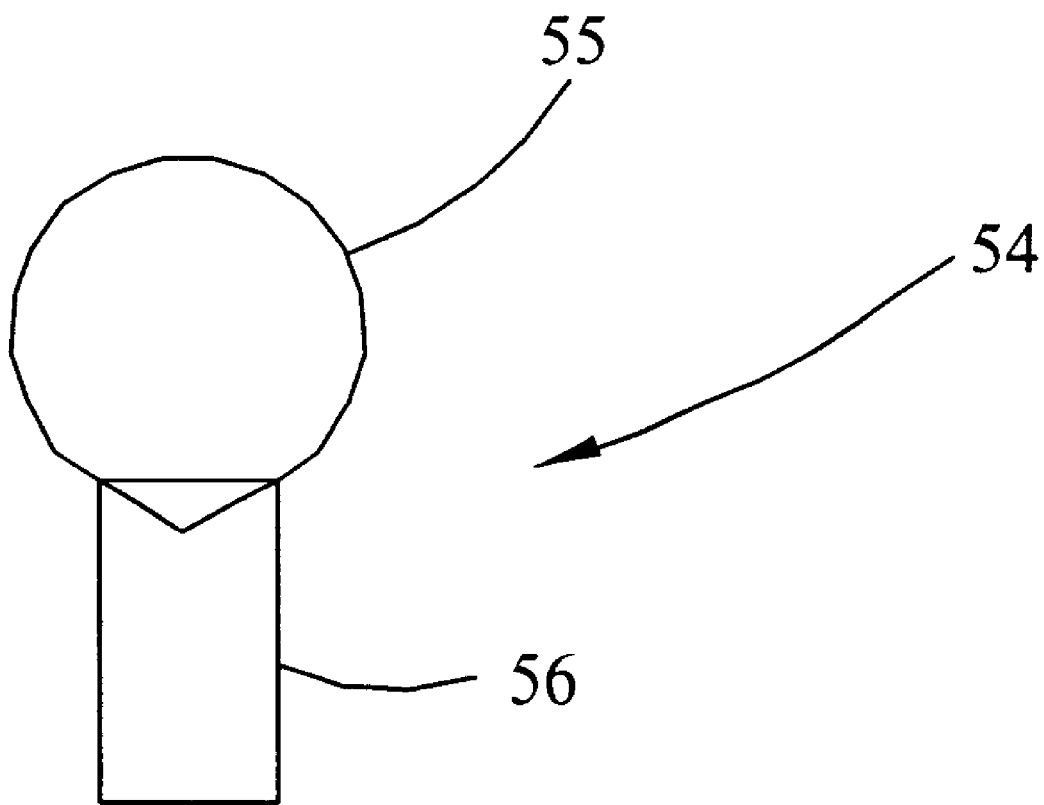
Figure 3J:
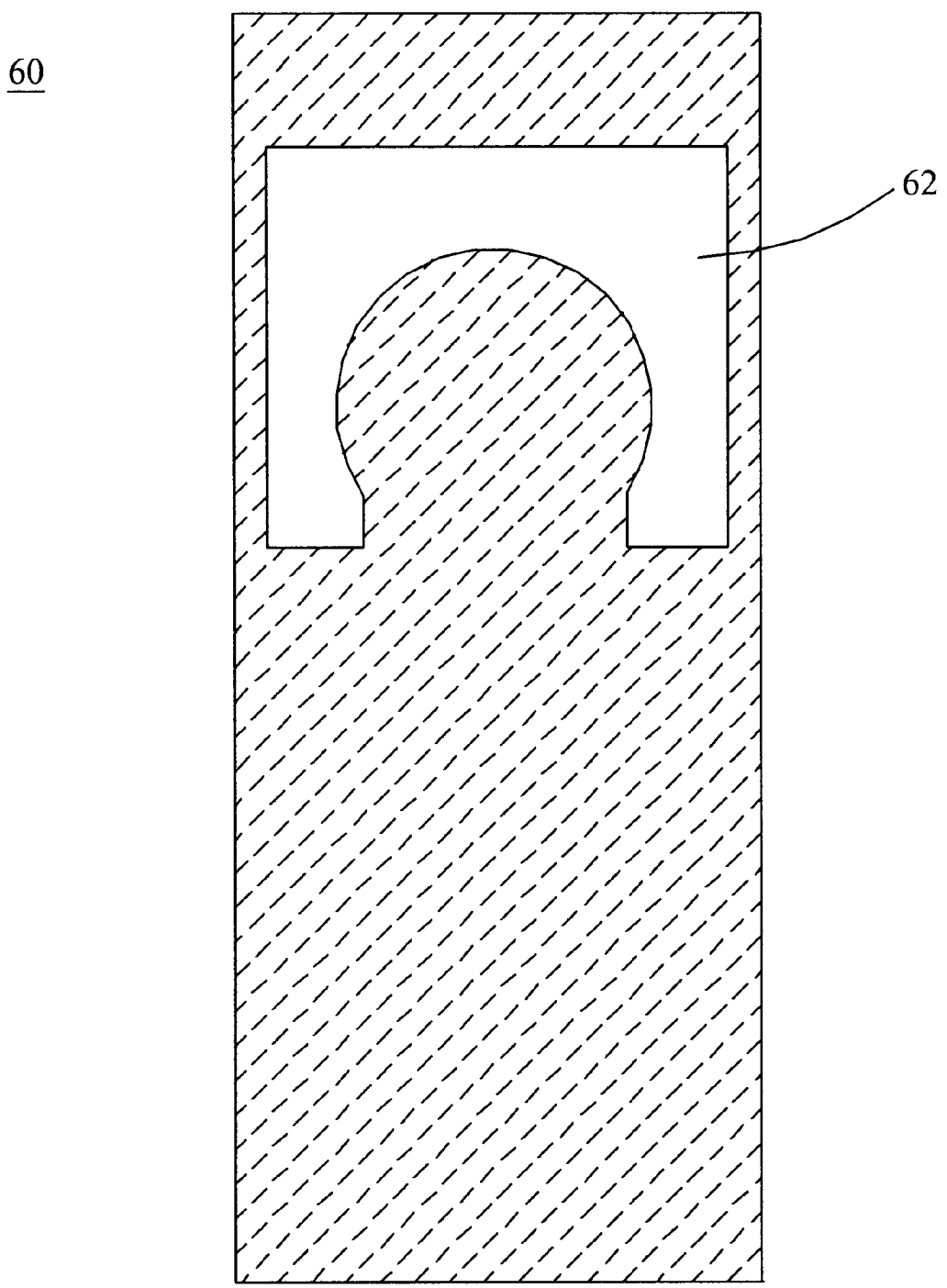

FIG. 3B is a cross-sectional view of first section 21 of the transistor 19 of FIG. 3A through line 3B—3B thereof. A substrate 20 that has a high resistivity (i.e., non-active, non-conductive, and insulative) is provided. For example, substrate 20 can be made of a gallium arsenide (GaAs) material or InP material. For the sake of simplicity, substrate 20 is not shown in FIGS. 3C, 3D, and 3E. Active semiconductor layers can have a thickness in the range of 2 to 4 microns, are formed on substrate 20. During processing, regions of active semiconductor layers are exposed to ion implantation, while other regions of active semiconductor layers are not. The regions 24 that are protected from ion implantation are active. The regions 28 that are exposed to ion implantation are "inactive" because exposure to ion implant processing removes semiconductor properties from the active layers of these regions 28. Referring to FIG. 3H, a top plan view of the active region 24 and inactive region 28 is shown.

Active region 24 includes a sub-collector layer 29 that preferably has a thickness of greater than 5000 Angstroms. A collector layer 30 that can have a thickness in the range of 5000 to 15000 Angstroms is disposed on sub-collector layer 29.

Collector contact 74 is an ohmic contact that electrically couples sub-collector layer 29 with a portion of first metal layer 84. In this embodiment, collector contact 74 can have a width in the range of 2 to 20 microns, and a thickness in the range of 500 to 3000 Angstroms. Preferably, collector contact 74 is made from a composite of gold-germanium, nickel, and gold.

Figure 3K:
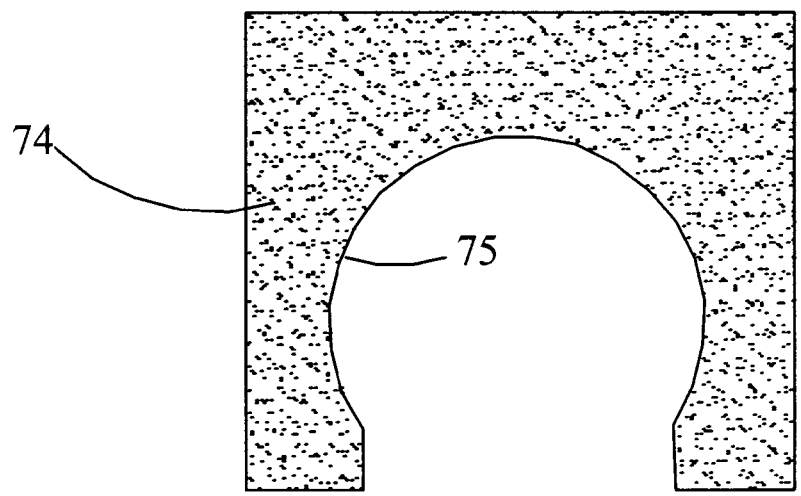

Preferably, collector contact 74 has a non-rectangular layout, such as a generally horse-shoe shape (shown in FIG. 3K). The horse-shoe layout includes a surface 75 that follows the contour or perimeter of emitter 44. This specific layout of collector contact 74 and emitter 44 reduces the resistance between collector contact 74 and emitter 44, thereby reducing power loss and dissipation. Power loss is an especially important consideration in low operating voltage designs because of the higher currents involved as compared to higher operating voltage designs.

Although a horse-shoe layout for collector contact 74 is shown, it is noted that the layout can have a perimeter defined by one or more straight portions, one or more curved portions, or a combination thereof. Moreover, any layout, non-rectangular or otherwise, that, in conjunction with specific layout of emitter 44 (described in greater detail hereinafter), allows current to flow radially from collector contact 74 to emitter 44, thereby reducing the collector-to-emitter resistance, can be utilized.

In this embodiment, first metal layer 84 can have a thickness in the approximate range of 0.5 to 2 microns. Preferably, first metal layer 84 is made from a metal composite of titanium, platinum, and gold. A second metal layer 104 is deposited over first metal layer 84. The thickness of second metal layer 104 can be in the approximate range of 1 to 6 microns. Preferably, second metal layer 104 is made from a metal composite of titanium, platinum and gold.

Figure 3L:
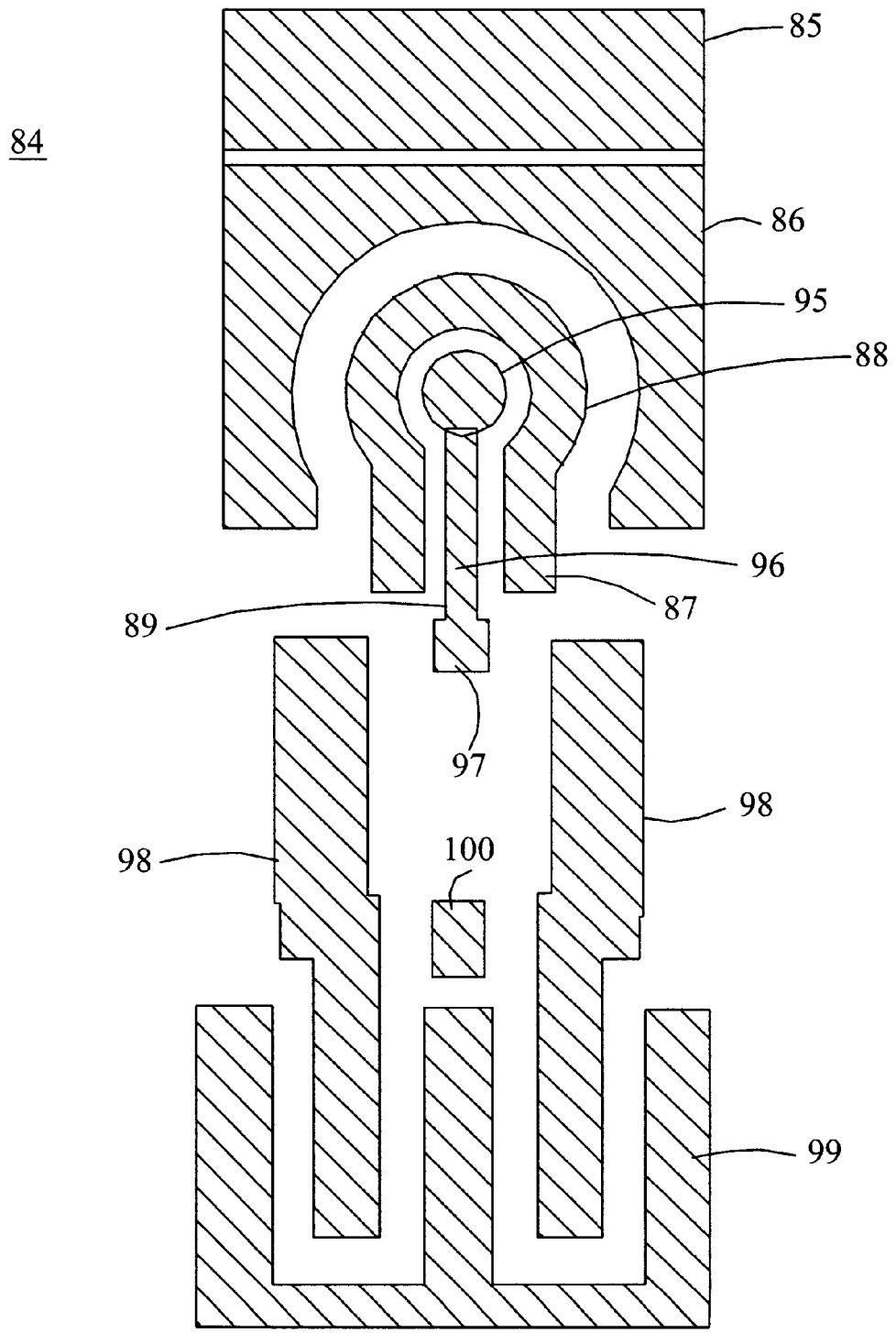
Figure 3M:
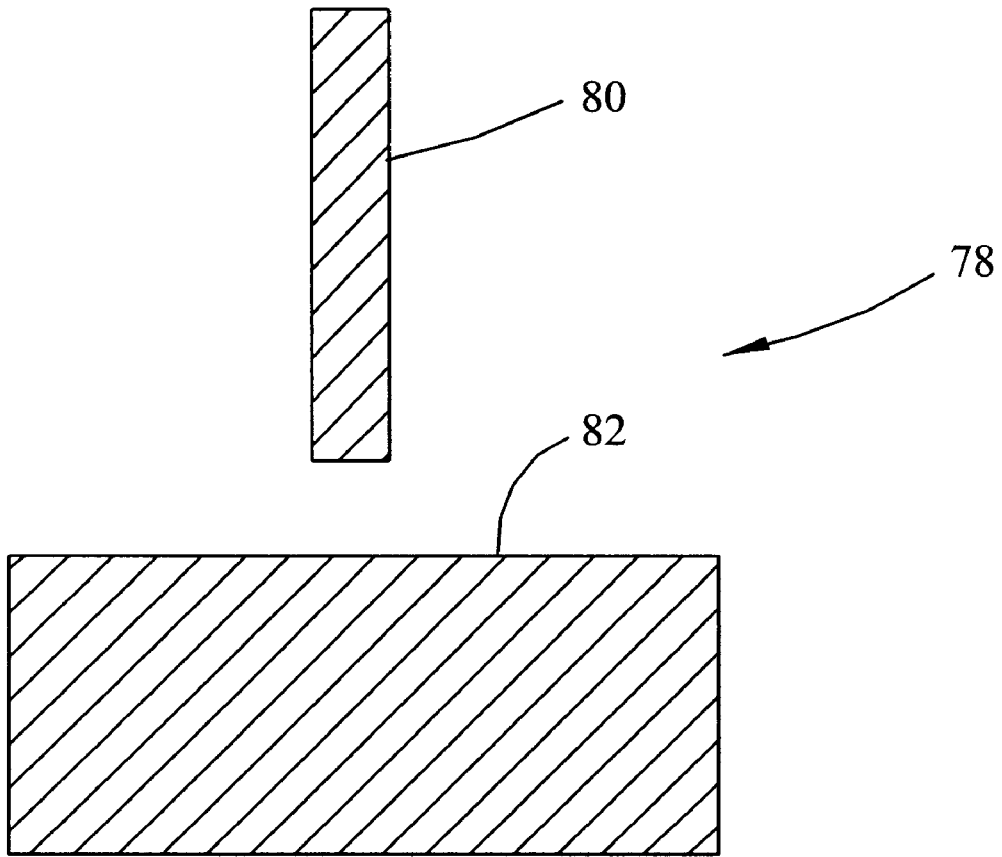

FIG. 3L illustrates a top plan view of first metal layer 84. First metal layer 84 includes a portion 85 for coupling to collector terminal 17, a portion 86 for coupling to collector contact 74, a portion 87 for coupling to emitter 44, and a portion 89 for coupling to base contact 54. Portion 87 includes a curved portion 88 for coupling to the emitter 44 through emitter contact 38 that has a layout that is similar to the layout of emitter 44. Portion 89 includes a generally circular portion 95 for coupling to portion 55 (shown in FIG. 3I) of base contact 54, a generally rectangular portion 96 for coupling to portion 56 (shown in FIG. 3I) of base contact 54, and a contact pad 97 for coupling to one end of base resistor 27. First metal layer 84 further includes two leg portions 98 for coupling portion 87 to one end of emitter resistor 26 through a portion of second metal layer 104, an "E"-shaped portion 99 for coupling a second end of emitter resistor 26 to emitter terminal 18, and a contact pad 100 for coupling to a second end of base resistor 27.

Figure 3N:
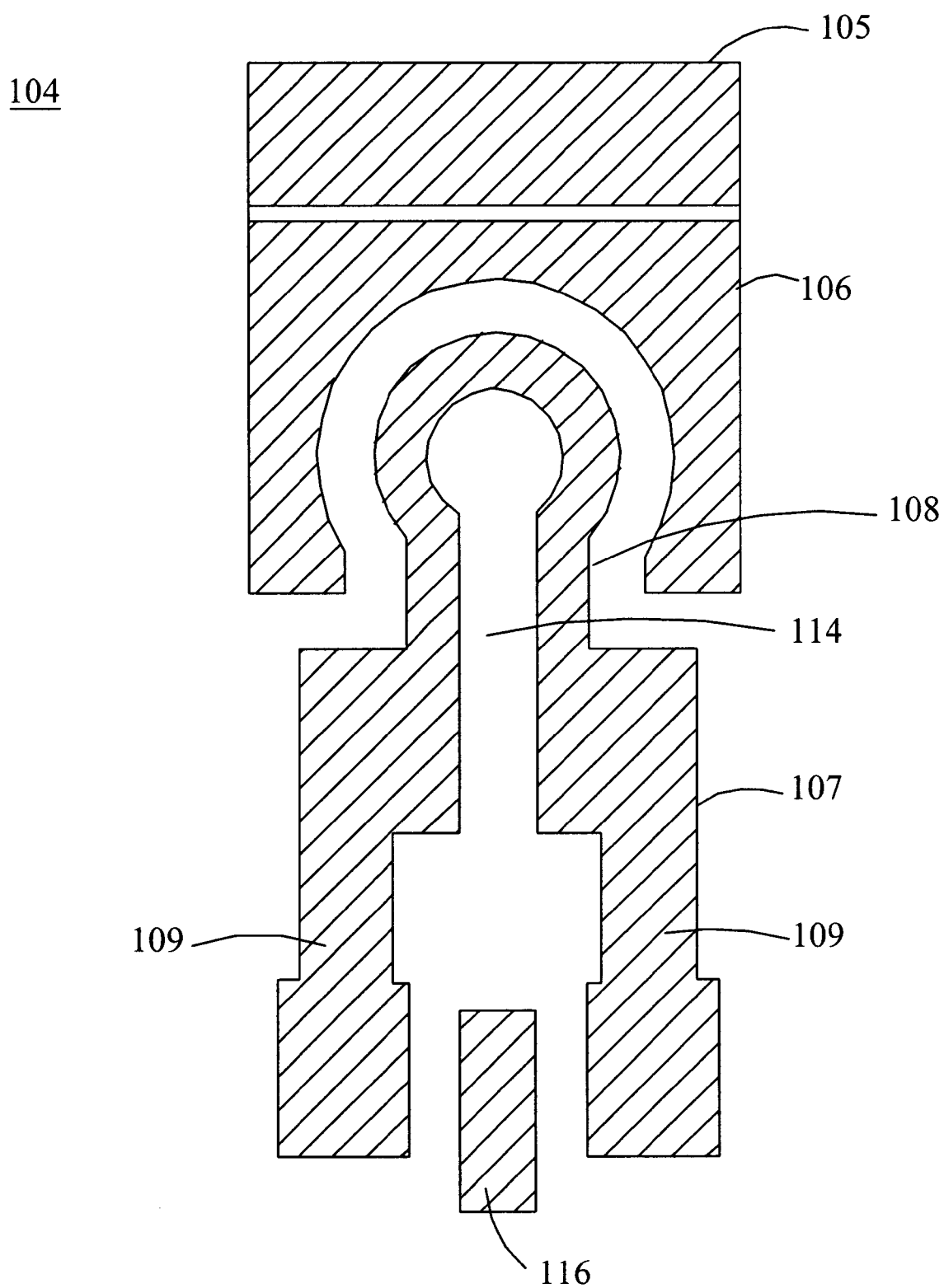

FIG. 3N illustrates a top plan view of second metal layer 104. Second metal layer 104 includes a portion 105 for coupling to portion 85 of first metal layer 84, a portion 106 for coupling to portion 86 of first metal layer 84, and a portion 107 for coupling to portion 87 and parts of leg portions 98 of first metal layer 84. Portion 107 includes a curved track portion 108 for coupling to curved track portion 88 of first metal layer 84 and two leg portions 109 for coupling to leg portions 98 of first metal layer 84. Portion 107 also defines a "key-shape" void 114. Second metal layer 104 further includes a contact pad 116 for coupling the second end of base ballast resistor 27 to base terminal 16.

Base contact 54, illustrated in FIG. 31, is disposed over a portion of base pedestal 50. Base pedestal 50 has a generally circular layout as illustrated in FIG. 3G. Base pedestal 50 can have a thickness in the range of 1000 to 2000 Angstroms. Base contact 54, which is an ohmic contact, electrically couples base pedestal 50 with a portion of first metal layer 84. Base contact 54 can have a thickness in the range of 1000 to 2000 Angstroms. Preferably, base contact 54 is made from a metal composite of titanium, platinum, and gold.

It is desirable that base pedestal 50 has a non-rectangular layout. Preferably, base pedestal 50 has a generally round or circular-shape layout. However, it is noted that base pedestal 50 can have any layout that is defined by one or more straight portions, one or more curved portions, or a combination thereof. For example, a layout featuring a polygon shape can be utilized.

Any layout for base pedestal 50, non-rectangular or otherwise, that in conjunction with the specific layout of collector contact 74, described previously, reduces the base-to-collector capacitance can be utilized. A lower base-to-collector capacitance increases the RF stability and signal linearity of the device. As noted earlier, a large base-to-collector capacitance adversely affects the electrical performance of the transistor by reducing the current gain through the transistor and subjecting the transistor to increase radio-frequency (RF) instability.

An emitter 44 is disposed on base pedestal 50. Emitter 44 can have a generally ring shaped layout, as illustrated in FIG. 3F. Emitter 44 can have a thickness in the range of 1000 to 3000 Angstroms.

An emitter contact 38 is disposed between emitter 44 and first metal layer 84 for electrically coupling emitter 44 to first metal layer 84. Emitter contact 38 and collector contact 74 can have a thickness in the approximate range of 1000 to 3000 Angstroms. Preferably, emitter contact 38 and collector contact 74 are made from a metal composite of gold-germanium (AuGe), nickel, and gold.

Figure 4A:
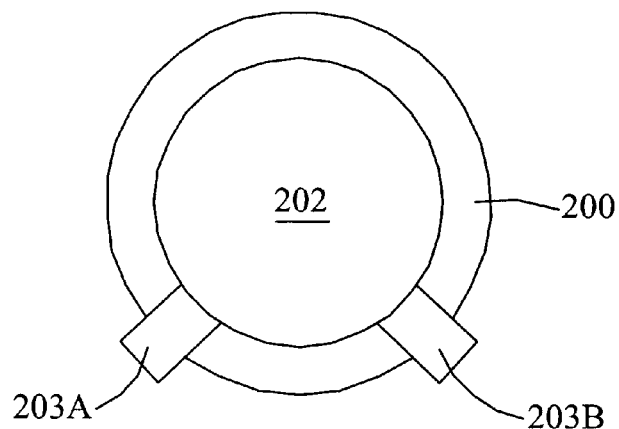
FIGS. 4A–4F illustrate several different alternative layouts of the emitter of the present invention.
Figure 4B:
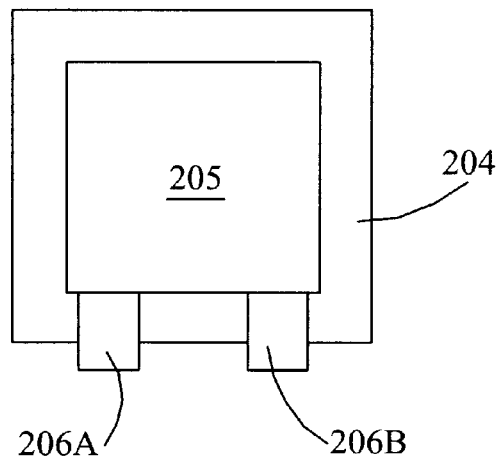
Figure 4C:
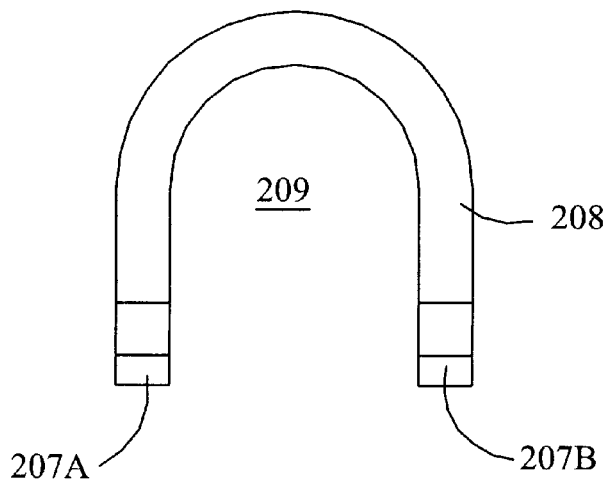
Figure 4D:
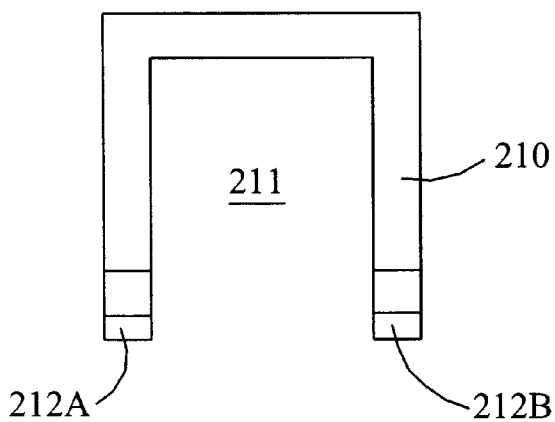
Figure 4E:
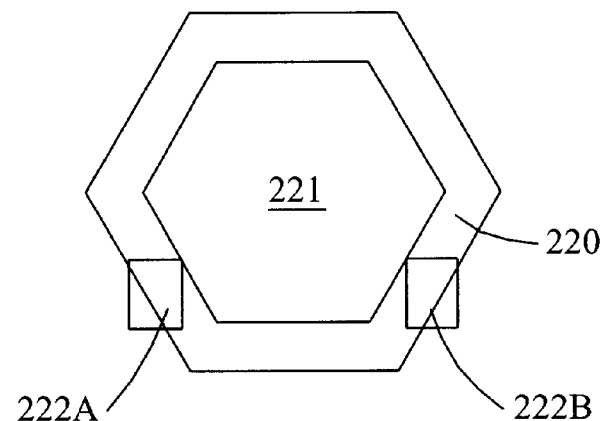
Figure 4F:
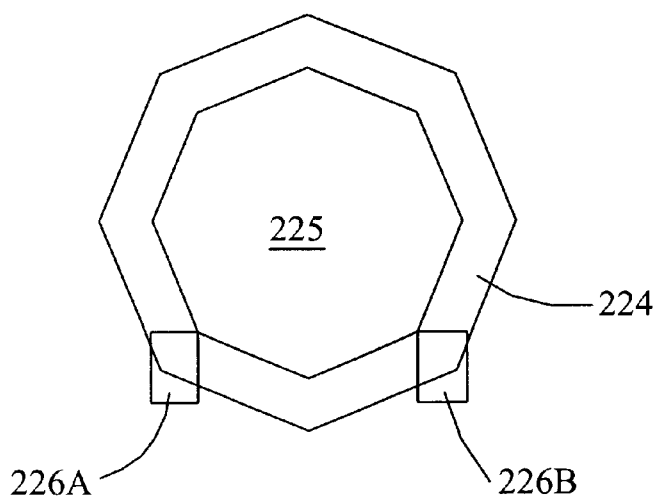

Although shown as having a ring-shape layout, emitter 44 and emitter contact 38 can have layouts with other configurations. FIGS. 4A–4F illustrate several different layouts for the emitter of the present invention. Emitter 44 can have a layout with a closed track as shown in FIGS. 4A, 4B, 4E, and 4F or a layout with an open track as shown in FIGS. 4C and 4D. As illustrated, the track can be circular 200, rectangular (not shown), square 204, arch-shaped 208, hexagonal 220, octagonal 224, and have one or more curved portions (see FIGS. 4A and 4C), one or more straight portions (see FIGS. 4B, 4D, 4E, and 4F), or a combination thereof. It will be understood by those of ordinary skill in the art that the emitter track can be in the form of other shapes.

It is desirable that the track define a center void (e.g., voids 202, 205, 209, 211, 221, or 225 of FIGS. 4A–4F) so that base contact 54 can be disposed in the void. By surrounding or enclosing (either partially or entirely) base contact 54, emitter 44 isolates base contact 54 from collector contact 74, thereby decreasing the base to collector capacitance.

It is also desirable that each emitter track includes more than one feed point. A feed point is a point on the emitter track at which current flows from the emitter and out of the transistor. For example, the feed point can be a demarcation point on the emitter track where emitter contact 38 and a metal layer (84 or 104) are coupled to bring current from emitter 44 to emitter terminal 18. In the preferred embodiment, two feed points (e.g., feed points 203A and 203B, 206A and 206B, 207A and 207B, 212A and 212B, 222A and 222B, or 226A and 226B) are provided to draw current from the emitter. The feed points can be positioned anywhere along the track within ordinary processing constraints. It will be understood by those of ordinary skill in the art that more than two feed points can be utilized.

Figure 3O:
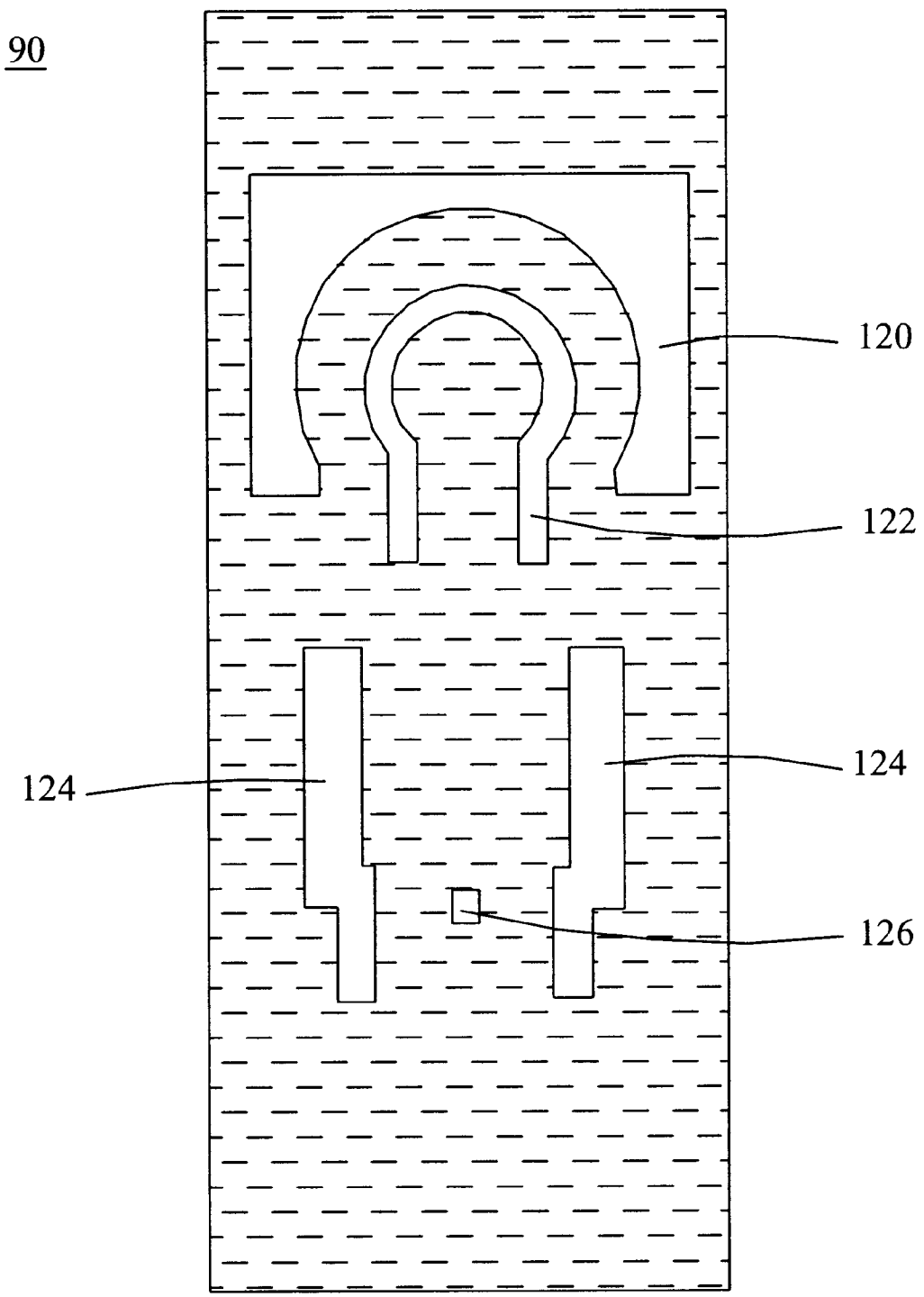

A first dielectric layer 60 defines a window 62 (see FIG. 3J) for allowing first metal layer 84 to couple to collector contact 74. Referring to FIG. 3O, a second dielectric layer 90 defines a first window or opening 120, a second window or opening 122, a pair of third windows or openings 124, and a fourth window 126.

Figure 3P:
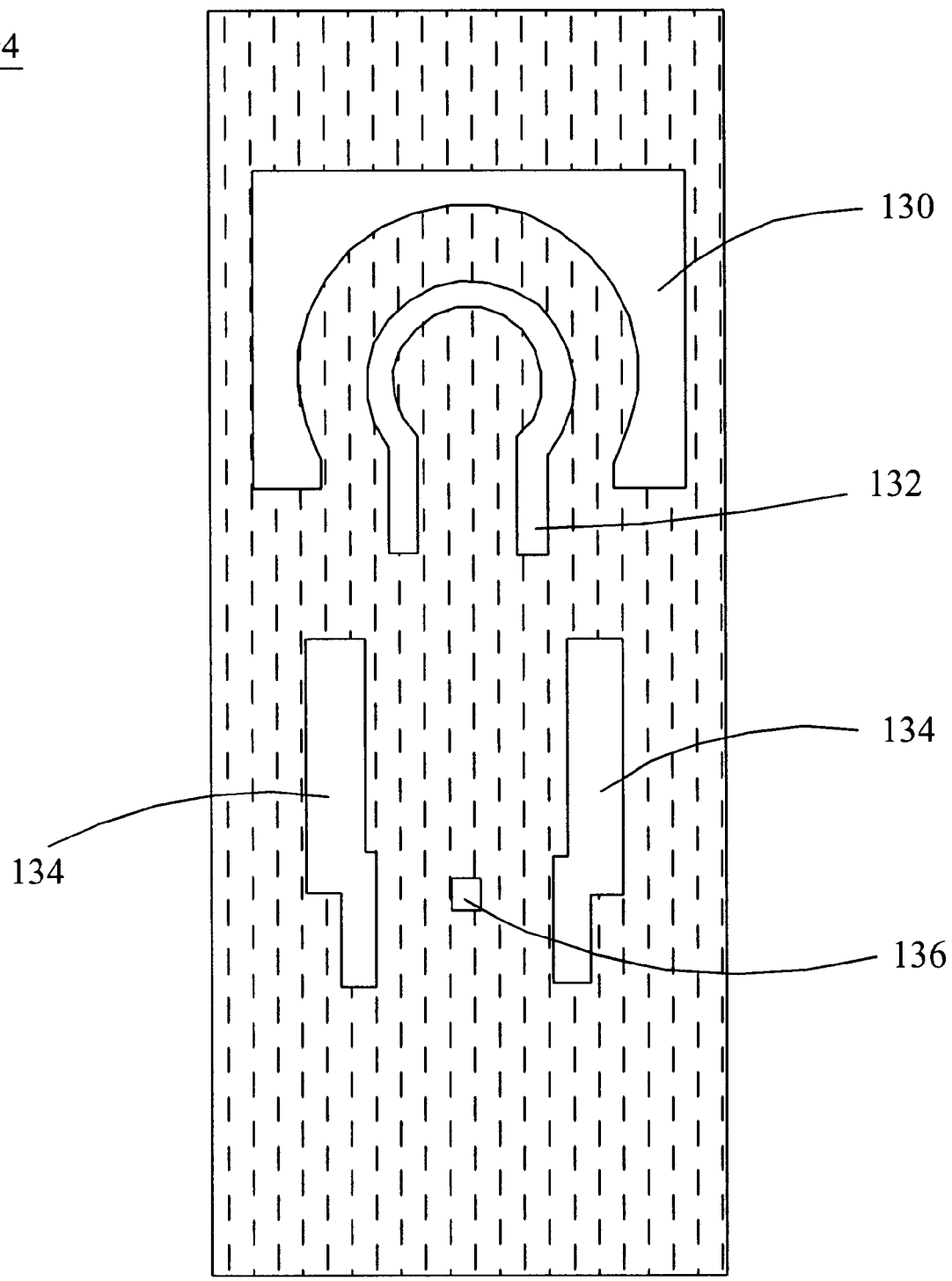

A thick third dielectric 94 is deposited over a second dielectric layer 90. Referring to FIG. 3P, a third thick dielectric layer 94 defines a first window or opening 130, a second window or opening 132, a pair of third windows or openings 134, and a fourth window 136. Thick third dielectric 94 preferably has a thickness in the range of 1 to 2 microns. Thick third dielectric 94 can be an insulative material, such as $SiO_2$, a polyimide material, or other material with a low dielectric constant. As described hereinafter, thick third dielectric 94 can be utilized as an insulative barrier between first metal layer 84 and second metal layer 104.

Windows 120 (see FIG. 3O) and 130 (see FIG. 3P) are opened in second dielectric 90 and third thick dielectric 94, respectively, so that portions of the second metal layer 104 can couple to first metal layer 84 over collector contact 74. Also, windows 122 (see FIG. 3O) and 132 (see FIG. 3P) are opened in second dielectric 90 and third thick dielectric 94, respectively, so that portions of the second metal layer 104 can couple to first metal layer 84 over emitter contact 38.

FIG. 3C is a cross-sectional view of second section 23 of the power transistor of FIG. 3A through 3C—3C. A first dielectric 60 is deposited on inactive region 28 (see also FIG. 3B) and serves to isolate inactive region 28 from first metal layer 84 and resistive material 78. Second dielectric 90 is deposited on first dielectric 60. Windows 124 (see FIG. 3O) and 134 (see FIG. 3P) are opened in second dielectric 90 and third thick dielectric 94, respectively, so that portions of the second metal layer 104 can couple to first metal layer 84. A resistive material 78, preferably tantalum nitride, is deposited between first dielectric 60 and second dielectric 90 to form base ballast resistor 27.

FIG. 3D is a cross-sectional view of third section 25 of the transistor of FIG. 3A through 3D—3D. First dielectric 60 is deposited over inactive region 28. Resistive material 78, preferably tantalum nitride, is deposited on first dielectric 60 to form a resistor, such as emitter ballast resistor 26. First metal layer 84 that is then deposited on resistive material 78 forms emitter terminal 18. As shown, windows 124 and 134 (see FIGS. 3O and 3P) in the second dielectric layer 90 and thick third dielectric 94, respectively, extend into third section 25 so that portions of first metal layer 84 and second metal layer 104 can be coupled in third section 25.

Processing of transistor 19 is now described. Processing begins with an epitaxial material, preferably made from GaAs. Epitaxial material includes a substrate 20 and active layers formed thereon. Active layers include a sub-collector layer 29, a collector layer 30 disposed on sub-collector layer 29, a base layer disposed on the collector layer 30, and an emitter layer disposed on the base layer.

An emitter ohmic contact 38 (see. FIGS. 3B and 3E) is formed on emitter layer by utilizing conventional lithography processing steps, such as evaporation deposition and reactive ion etch. Emitter contact 38 is a conductive material and is preferably a composite of gold-germanium, nickel, and gold.

Emitter layer is selectively etched to form emitter 44. Emitter 44 is formed by utilizing conventional lithography processing steps. Preferably, a reactive ion etch is utilized to etch away non-protected areas of emitter layer to form emitter 44.

Base layer and collector layer 30 are etched to define the base pedestal 50. Base pedestal 50 is formed by utilizing conventional lithography processing steps. A chemical etch or reactive ion etch is then utilized to etch away the non-protected areas of collector layer 30 and base layer to form base pedestal 50.

An isolation implant processing step makes region 28 non-active or insulative, upon which passive components can be advantageously built.

A base ohmic contact 54 is deposited on the base pedestal 50. Base ohmic contact 54 is formed by utilizing conventional lithography processing steps, such as evaporation deposition and reactive ion etch. Base contact 54 can be a conductive material and is preferably a composite of titanium, platinum, and gold.

A first dielectric layer 60 is preferably deposited over the transistor 19 by a chemical vapor deposition (CVD) process, and windows are etched therein preferably with photolithography and a reactive ion etch. First dielectric 60 can have a height in the range of 800 to 2000 Angstroms. Windows are etched in first dielectric layer 60 to expose emitter contact 38, base contact 54, and collector contact 74.

Sub-collector layer 29 and collector layer 30 are etched to form a trench 76 by a wet etch or dry etch, preferably a reactive ion etch (RIE). Collector contact 74 is deposited in the trench 76 and disposed on sub-collector layer 29.

A thin film resistor is formed with a resistive material 78 by utilizing conventional thin film processing steps. The thin film resistor is preferably formed by evaporation of nickel chromium or sputtering of tantalum nitride. The thickness of resistive material 78 is chosen to realize a desired sheet resistance. For example, resistive material 78 can have a thickness in the range of 1000 to 2000 Angstroms, depending on the type of resistive material utilized. Electrical contacts (not shown) for electrically coupling the resistor to base contact 54 or emitter contact 38 are formed by a lift-off process. For example, this process step is utilized to form emitter ballast resistor 26 and base ballast resistor 27.

A first metal layer 84 is deposited on first dielectric layer 60. First metal layer 84 is deposited preferably by evaporation, plating, or sputtering, defined by conventional photolithography, and excess metal is removed from the wafer by a lift-off process.

A second dielectric layer 90 is deposited on first metal layer 84 by a CVD process, and windows are etched therein by utilizing photolithography and a reactive ion etch. Preferably, first dielectric 60 and second dielectric 90 are made of an insulative material, such as silicon dioxide ($SiO_2$), silicon nitride ($Si_3N_4$), or other suitable insulative material.

A second metal layer 104 is deposited over second dielectric 90. Second metal layer 104 is deposited preferably by evaporation, plating, or sputtering, defined by conventional photolithography, and excess metal is removed from the wafer by a lift-off process.

A thick third insulative layer 94 is deposited over second metal layer 104. Thick insulative layer 94, which is preferably made from polyimide, is deposited by utilizing a spin-on deposition process and subsequently oven cured. Thick third dielectric 94 preferably has a thickness in the range of 1 to 2 microns. Thick third insulative layer 94 can also be made from other insulative materials, such as $SiO_2$. As described previously, thick third dielectric 94 can be utilized to selectively isolate first metal layer 84 and second metal layer 104.

A passivation layer (not shown) that provides scratch and moisture protection is deposited to coat the entire transistor 19. Preferably, passivation layer is made of a material that blocks moisture ingression. For example, the passivation layer can be made of silicon nitride and deposited by a chemical vapor deposition (CVD) process.

In the preferred embodiment, collector contact 74 is made from a composite of three metals, namely gold-germanium, nickel, and gold. First metal (M1) layer 84 and second metal (M2) layer 104 are made from a composite of titanium, platinum, and gold.

The present invention is preferably practiced in, but is not limited to, a HBT process flow. For example, the layout of the present invention can be implemented by those of ordinary skill in the art into the process flows practiced by companies such as Rockwell Semiconductor Systems (assignee of the present application), Hewlett Packard, TRW, RF MicroDevices, Fujitsu, and Texas Instruments. Preferably, the present invention is implemented in assignee's Self-Aligned Dielectric Assisted Planarization (SADAP) process which has been previously published by the assignee of the present invention. For further information regarding the SADAP process, please refer to, "III–V Heterojunction Bipolar Transistors for High Speed Applications," International Journal of High Speed Electronics, Vol. 1, Nos. 3 & 4 (1990), 245–301, World Scientific Publishing Company.

The area of each transistor cell 19, configured in accordance with the teachings of the present invention, is on the average approximately two times smaller than the area of a conventional transistor cell 1 with a conventional layout. The reduction in transistor cell area leads to significant cost savings and a resulting reduction in the area of a power amplifier that incorporates the transistor 19 of the present invention.

HEAT SHUNTING EMBODIMENT WHERE EACH TRANSISTOR CELL INCLUDES AN EMITTER BALLAST RESISTOR

In the description of the second and third embodiments of the present invention, for the sake of brevity, the description of common elements will not be repeated. Instead, the main differences between the embodiments will be emphasized. Common elements are denoted by a common identifier with a different suffix letter. Generally, elements in he second embodiment have the suffix "A", and elements in the third embodiment have he suffix "B".

A potential consequence of the compact layout of the power transistor 19 configured in accordance with the present invention is an adverse thermal impact. In other words, the intrinsic transistor 21, especially emitter 44, may be exposed to higher thermal temperatures than a transistor having a larger layout. To offset these potential thermal effects, thermal shunting techniques are employed by the present invention. These are illustrated in the second embodiment of the present invention as shown in FIGS. 5A–5K.

The first section 21A of the transistor 19A configured in accordance with a second embodiment of the present invention is identical to the first section 21 of the first embodiment of the present invention except for the following differences.

Figure 5A:
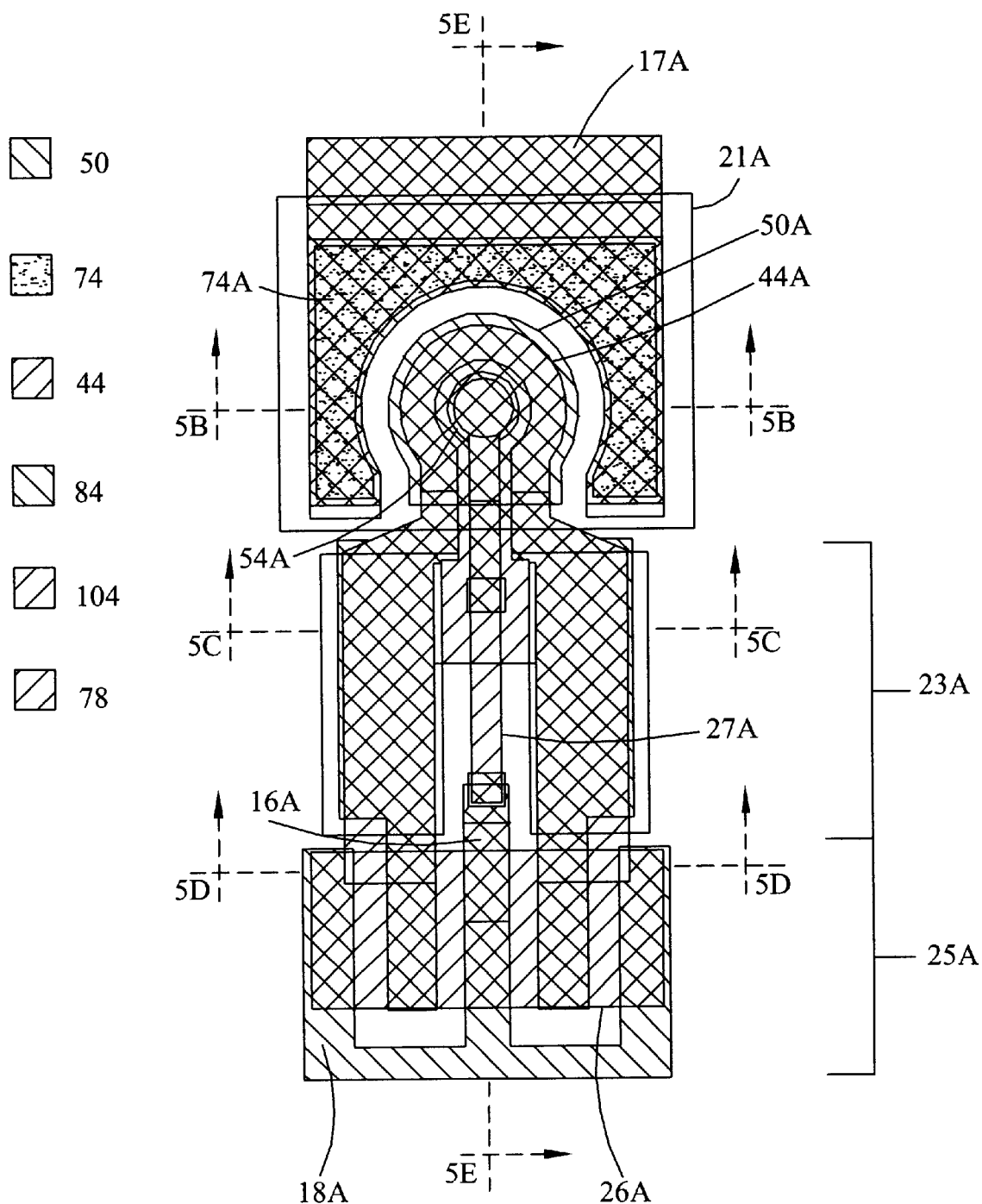
FIG. 5A is a top view of a layout of a transistor configured in accordance with a second embodiment of the present invention.
Figure 5B:
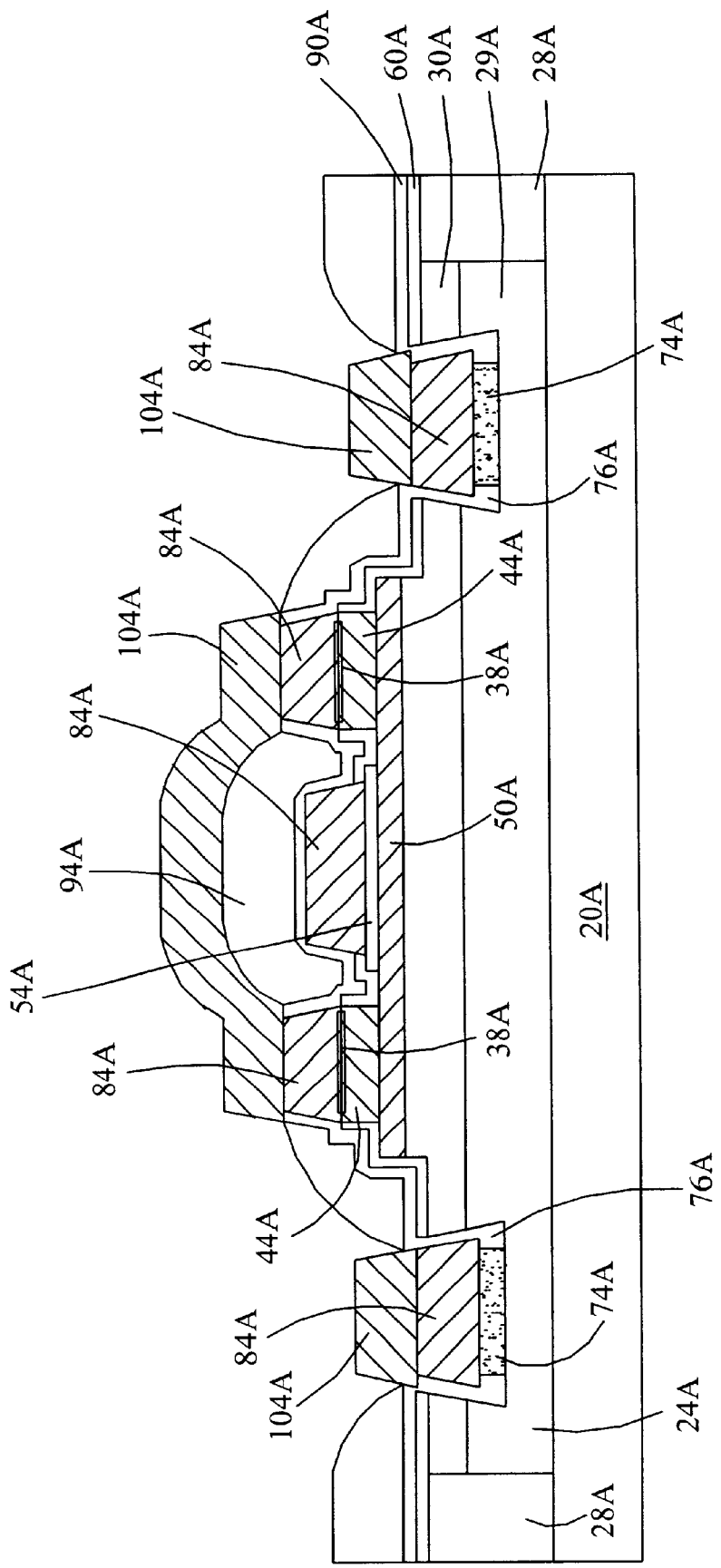
FIG. 5B is a cross-sectional view of a first section of the transistor of FIG. 5A through line 5B—5B (Sec. 5B).
Figure 5C:
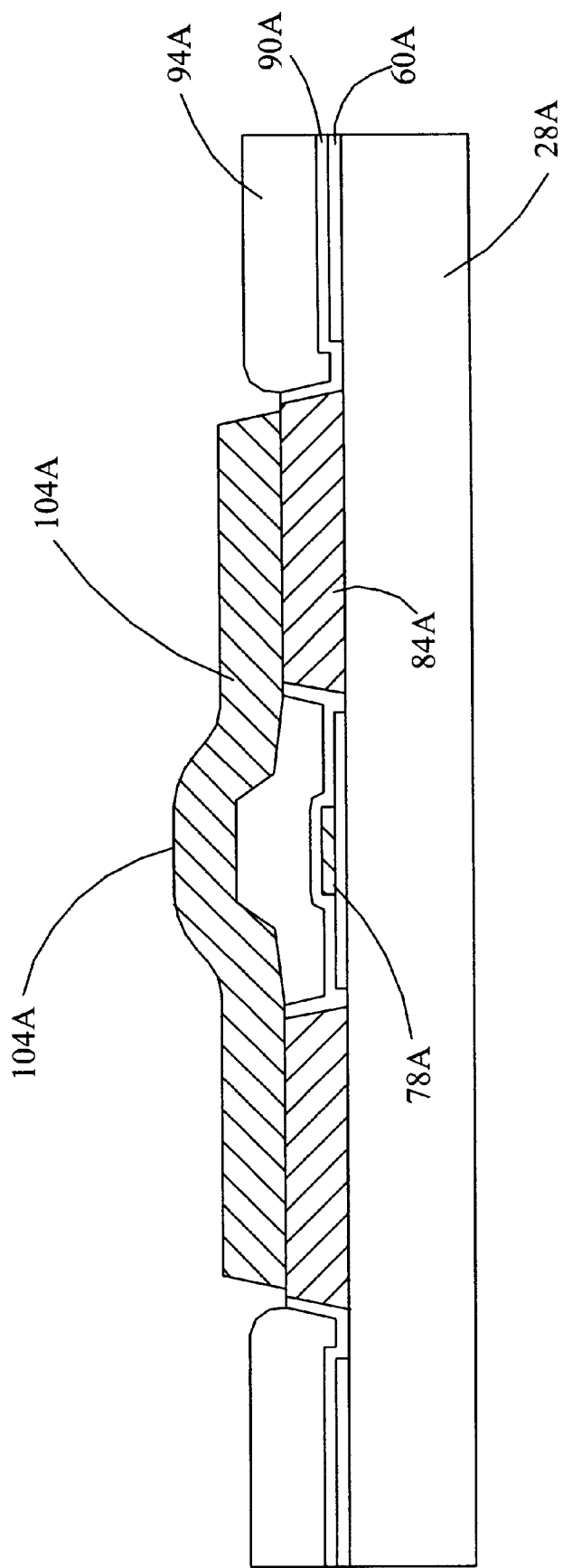
FIG. 5C is a cross-sectional view of a second section of the transistor of FIG. 5A through line 5C—5C (Sec. 5C).
Figure 5D:
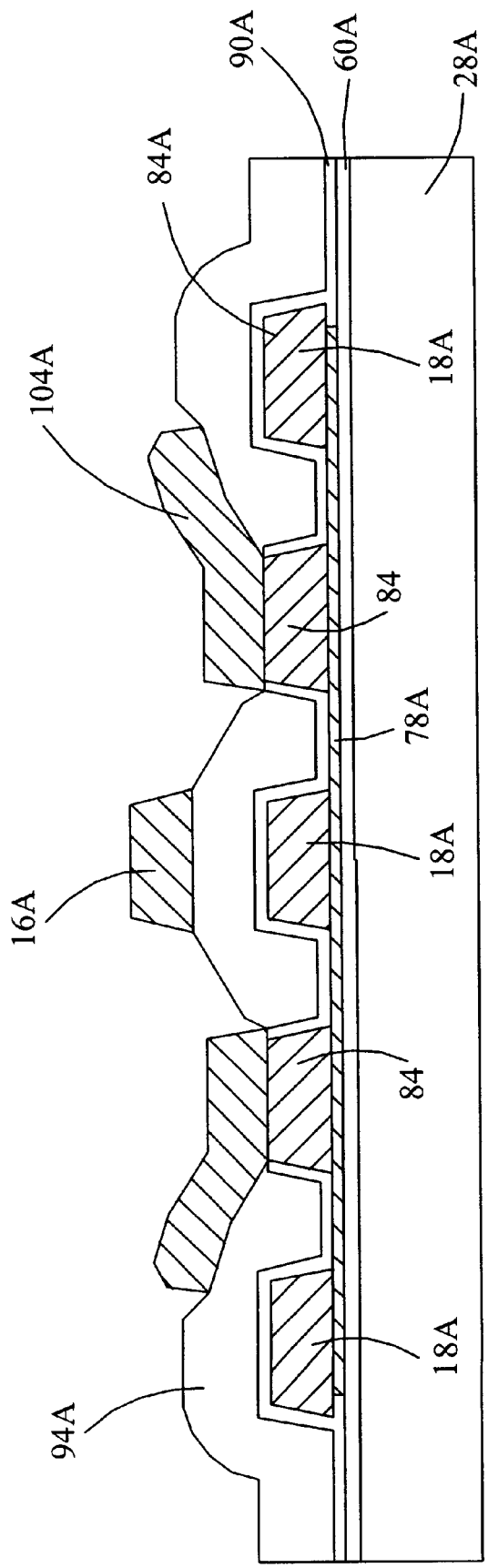
FIG. 5D is a cross-sectional view of a third section of the transistor of FIG. 5A through line 5D—5D (Sec. 5D).
Figure 5E:
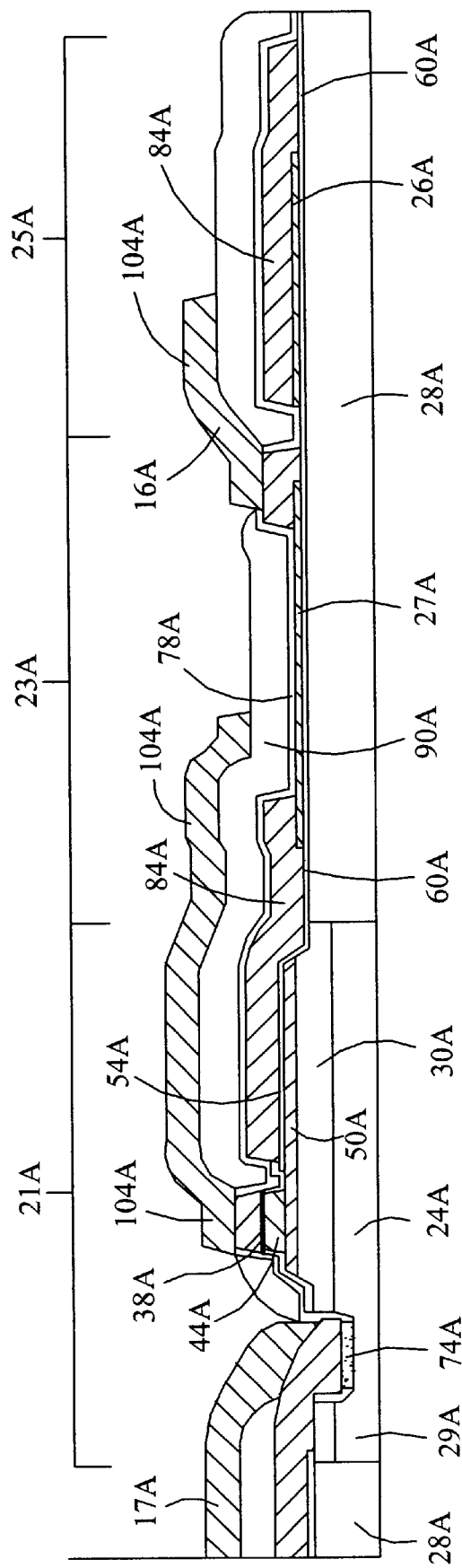
FIG. 5E is a cross-sectional view of the transistor of FIG. 5A through line 5E—5E (Sec. 5E).
Figure 5F:
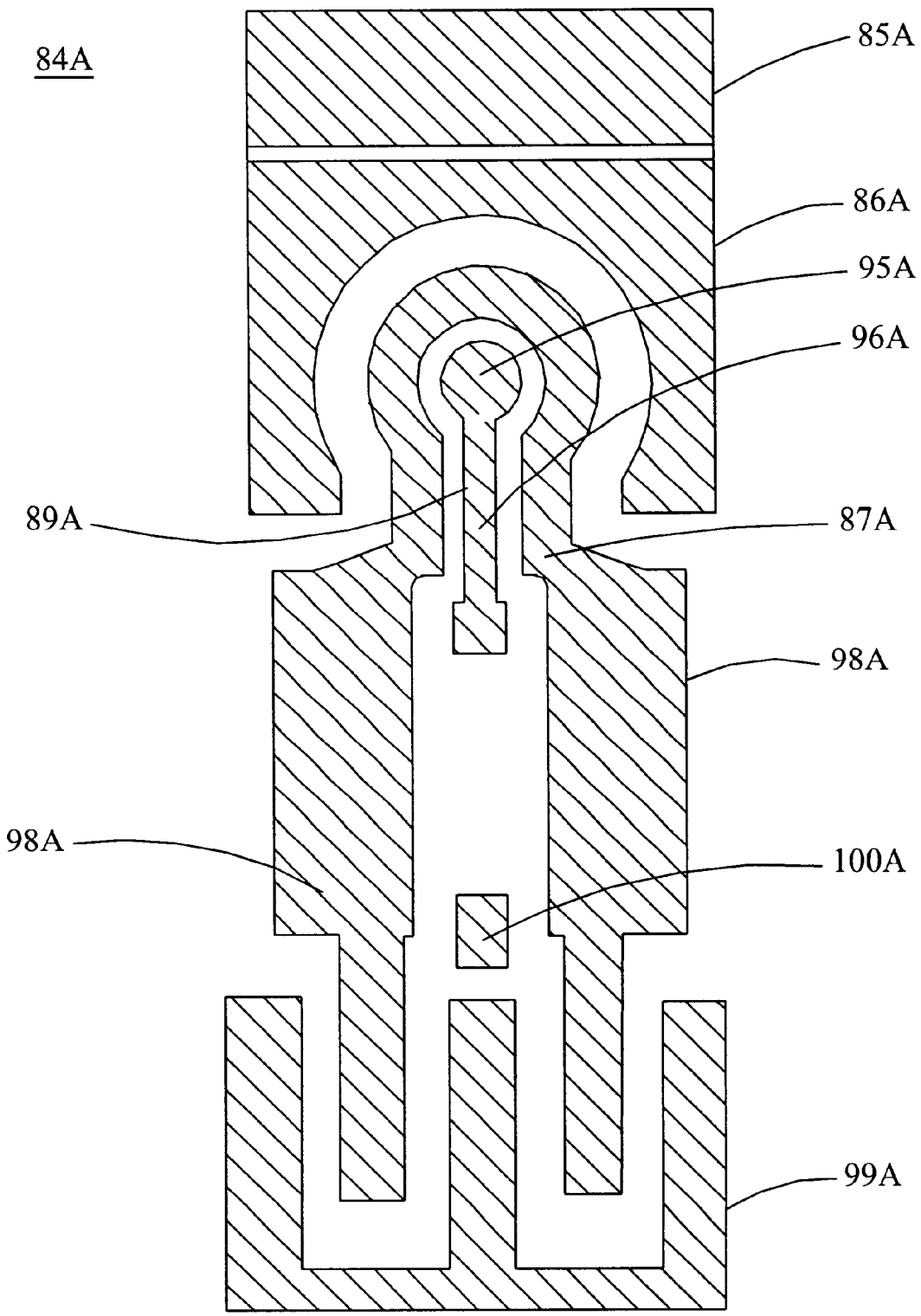
FIGS. 5F–5K are top views of selected layers in the transistor of FIG. 5A.

Comparing FIGS. 3L and 5F, portion 87A is formed integrally with portions 98A, and portions 98A are wider than portion 98 of FIG. 3L for more effective distribution of heat.

Figure 5G:
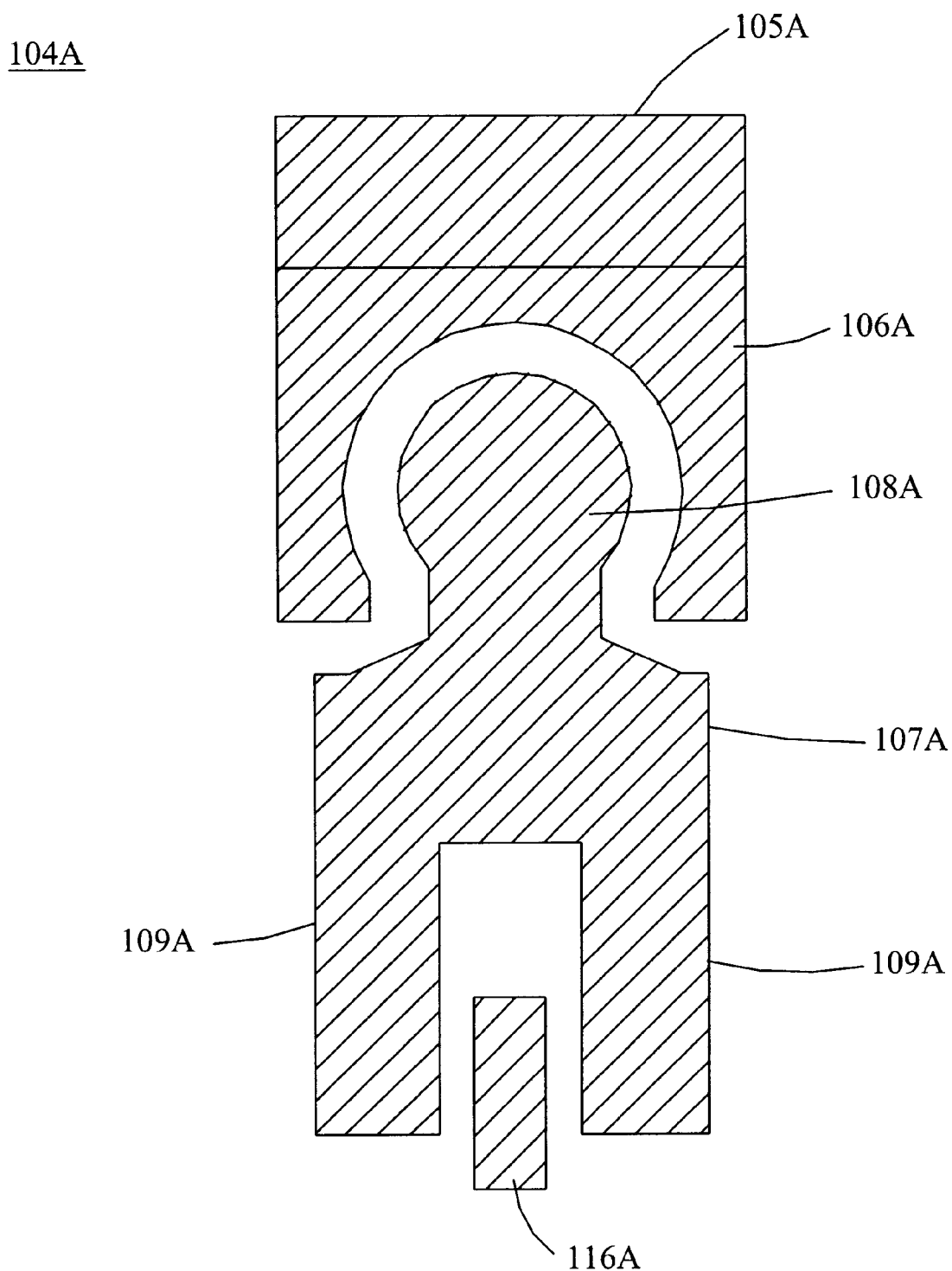

Referring to FIGS. 5B, 5C and 5G, the key-shape void 114 second metal layer 104 of FIG. 3N is filled with a second metal. Therefore, referring to FIGS. 5B, 5C, 5E, and 5G, portion 108A extends to substantially cover the area of base pedestal 50A, that is, portion 108A is deposited to cover both the area occupied by emitter 44A and base contact 54A. By covering the full width of emitter ring 44A, a more even distribution of heat away from emitter ring 44A is achieved. Comparing FIGS. 3N and 5G, portion 107A extends longitudinally along substantially, but not the entire, width of second section 23A. Portion 109A also has a slightly different configuration as best illustrated by comparing FIGS. 3N and 5G.

Portion 107A and 109A act as wide metal shunts that are used to transfer heat away from emitter 44A to inactive region 28A in second section 23A (where more effective and even heat distribution can be accomplished) through openings 64A (see FIG. 5I) in first dielectric layer 60. FIG. 5I also illustrates the windows 64A in first dielectric layer 60A through which heat conveyed by first metal layer 84A can be dissipated in second section 23A. This structure affords the additional advantage of having the heat shunted to second section 23A of transistor 19A, which is generally cooler than first section 21A. Heat flows from emitter 44A in first section 21A to inactive region 28A in second section 23A through first metal layer 84A and second metal layer 104A.

Figure 5H:
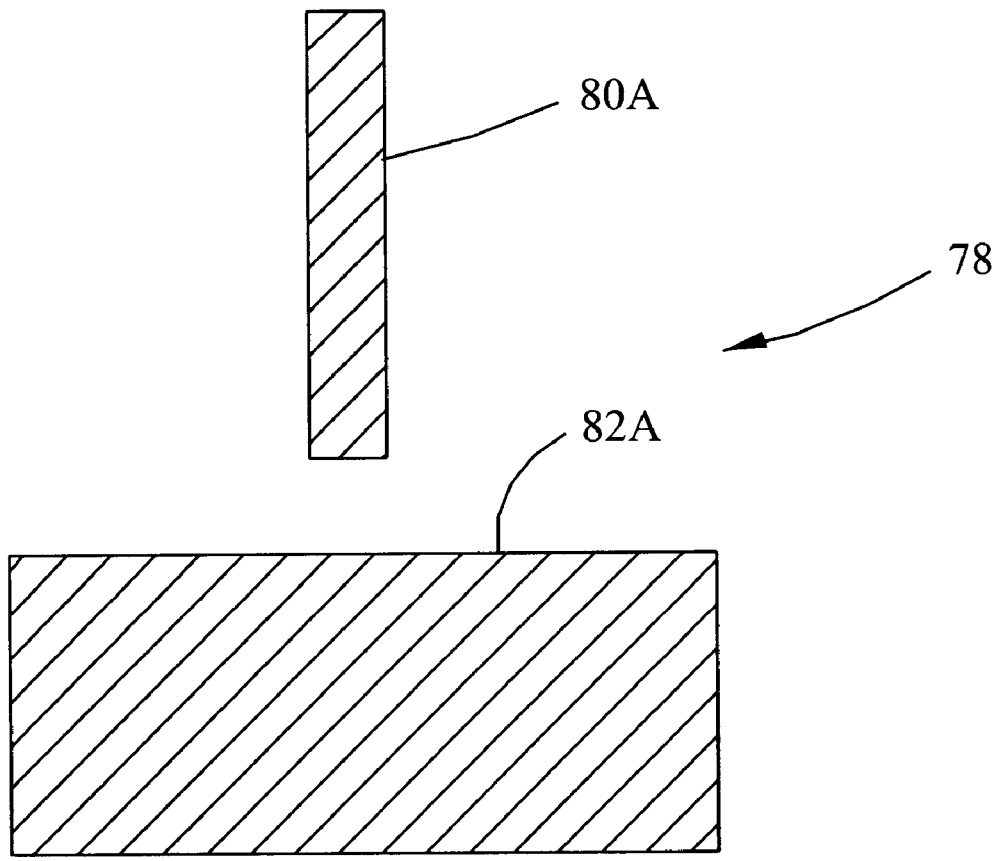
Figure 5I:
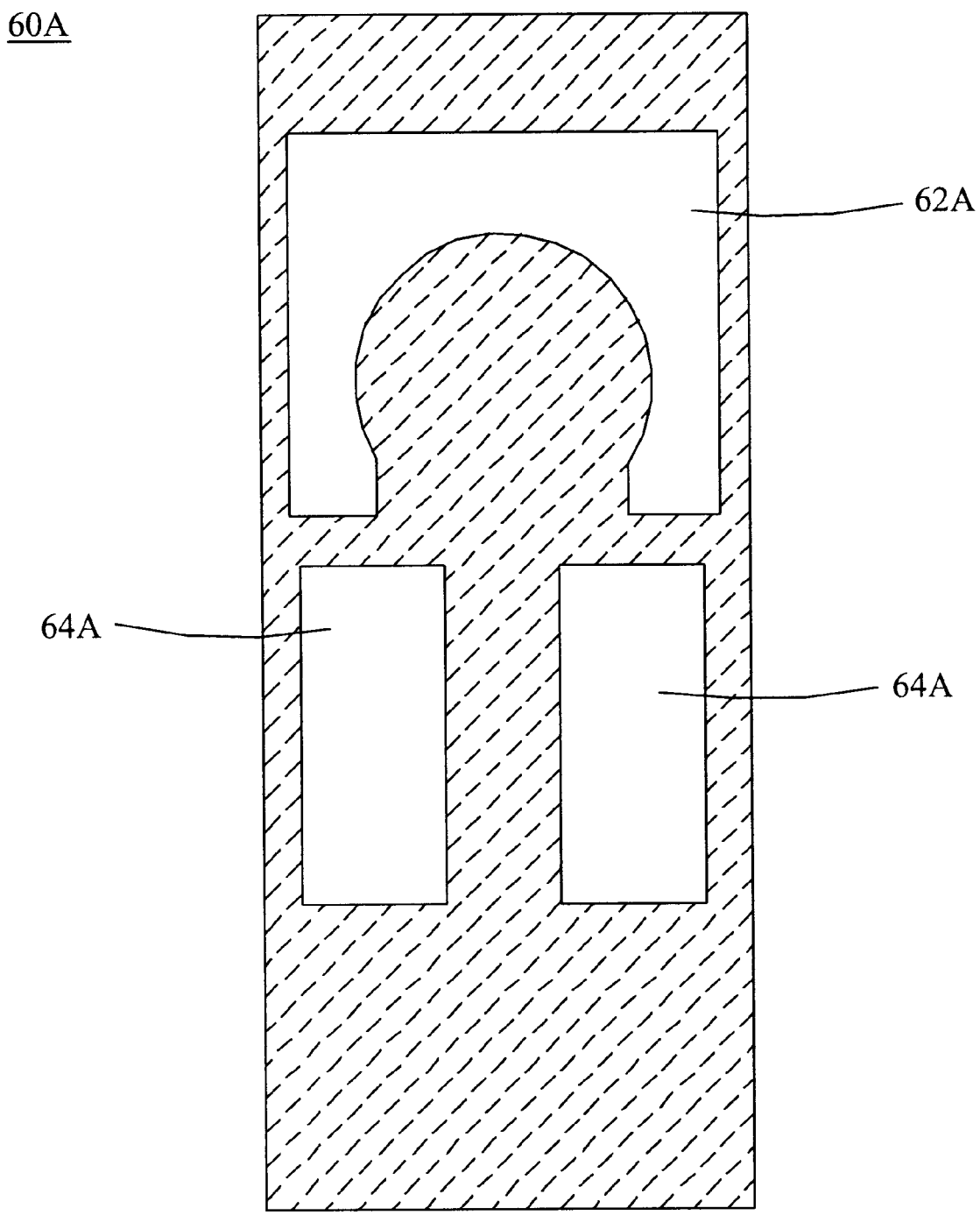
Figure 5J:
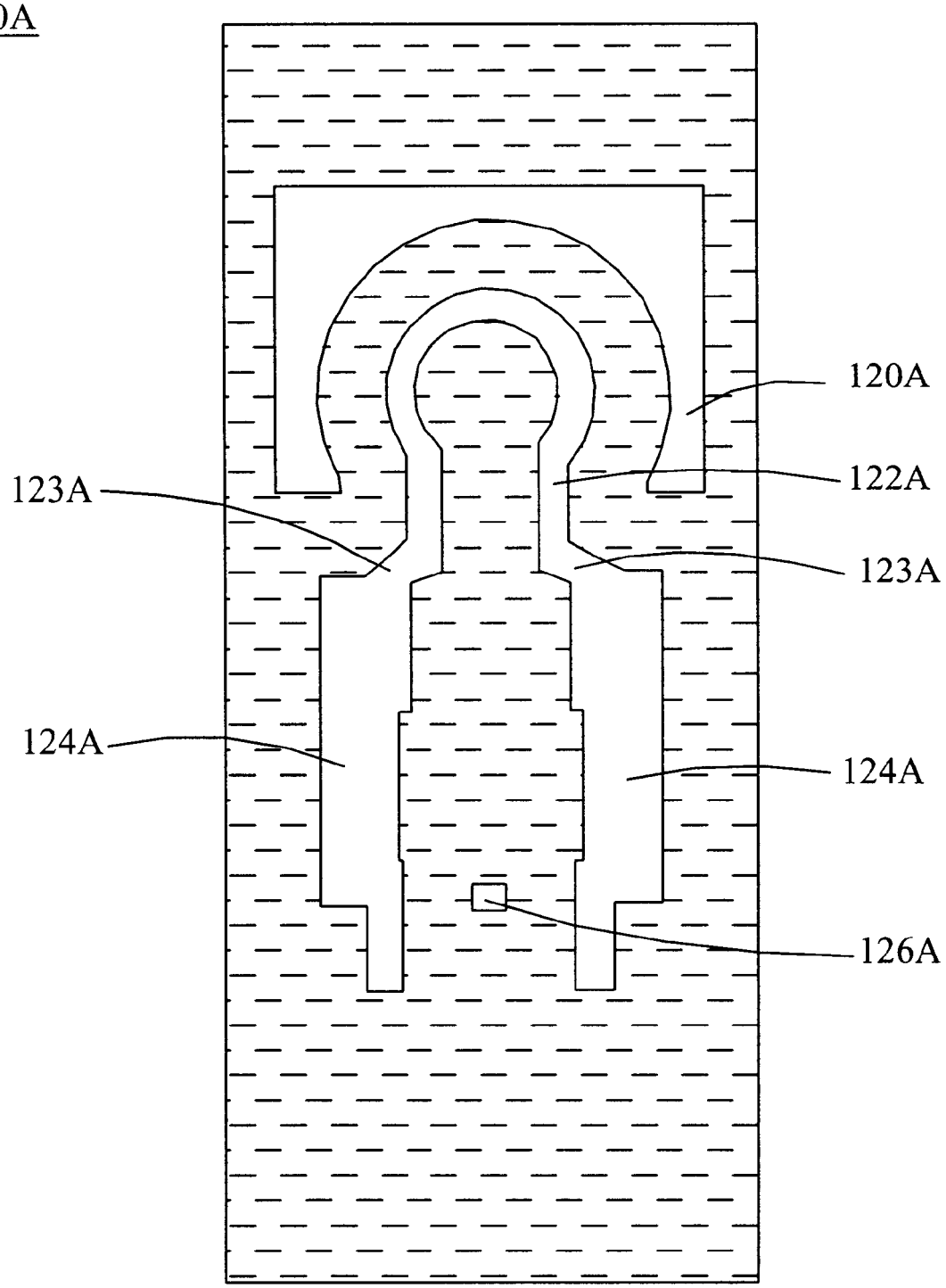

Comparing FIGS. 3O and 5J, windows 124A are wider than windows 124 of the first embodiment so as to increase the contact area between the first 84A and second 104A metal layers for heat shunting purposes. Moreover, second dielectric layer 90A defines additional windows 123A that join window 122A with windows 124A.

Figure 5K:
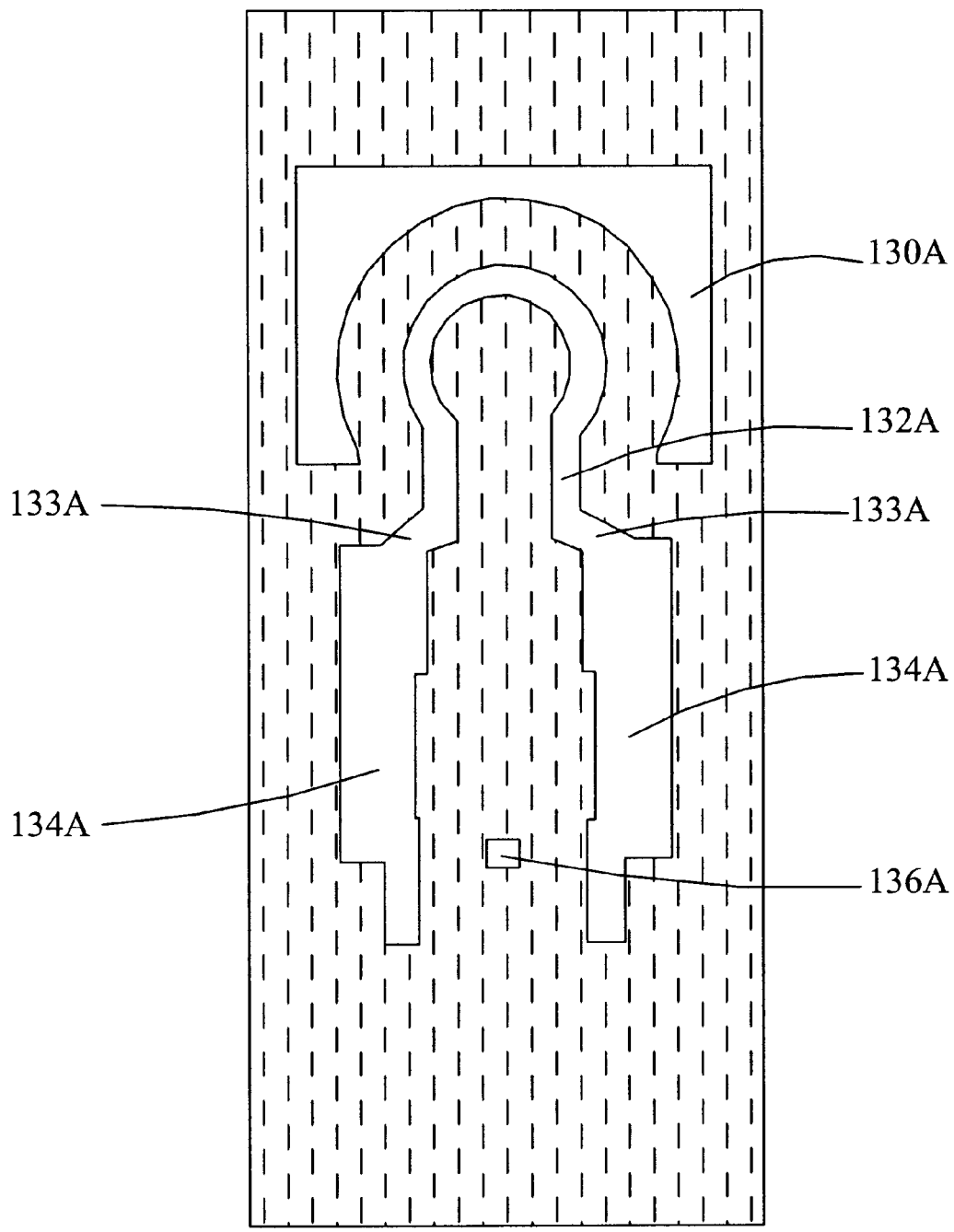

Comparing FIGS. 3P and 5K, windows 134A are wider than windows 134 of the first embodiment so as to increase the contact area between the first 84A and second 104A metal layers for heat shunting purposes. Moreover, third dielectric layer 94A defines additional windows 133A that join window 132A with windows 134A.

Third section 25A includes an emitter ballast resistor 26A from a resistive material 82A (see FIG. 5H). Emitter ballast resistor 26A is employed to regulate the current density within each transistor cell 19A by providing feedback to the transistor.

Figure 7:
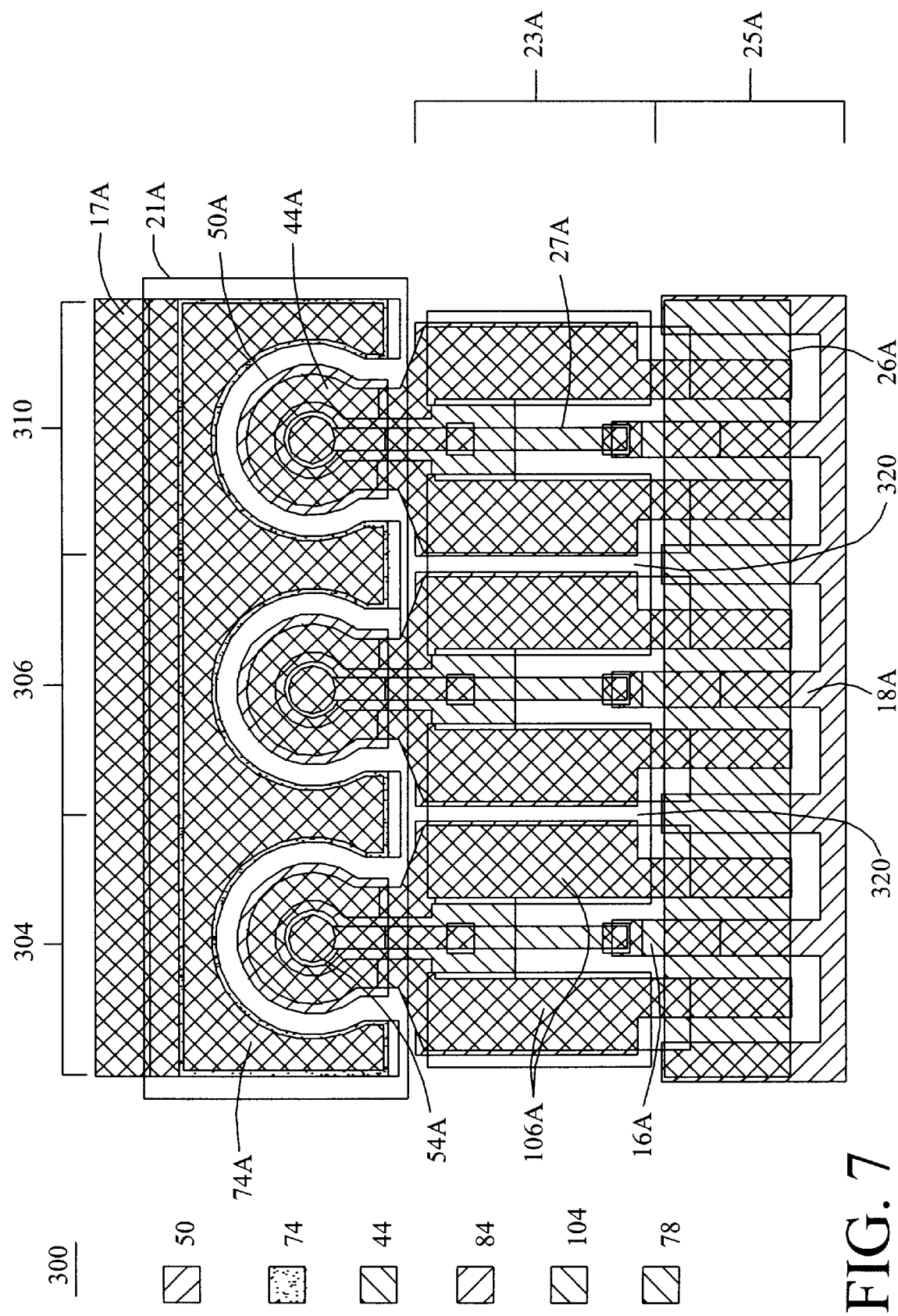
FIG. 7 is a top plan view of a block of transistors that are configured in accordance with the second embodiment of the present invention.

FIG. 7 is a top plan view of a block 300 of three transistor cells (304, 306, and 310) that are configured in accordance with the second embodiment of the present invention. It is noted that there is a gap 320 between the first metal layer 84A and the second metal layer 104A of second sections 23A. Accordingly, emitter ballasting can be performed in each transistor cell (e.g., 304, 306, 310) independent of the adjacent transistor cells.

HEAT SHUNTING EMBODIMENT WHERE EACH TRANSISTOR CELL DOES NOT INCLUDE AN EMITTER BALLAST RESISTOR

Figure 6A:
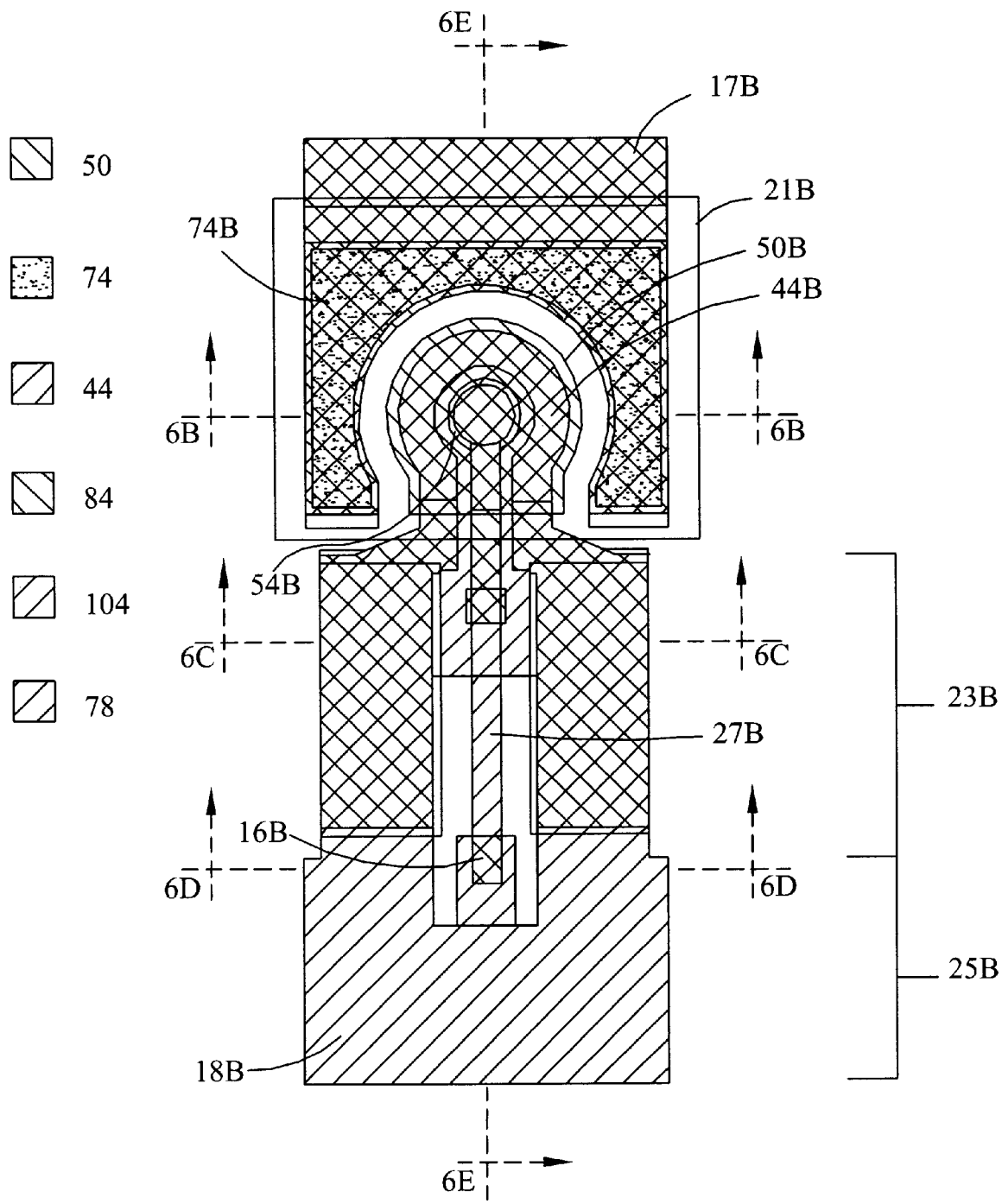
FIG. 6A is a top view of a layout of a transistor configured in accordance with a third embodiment of the present invention.
Figure 6B:
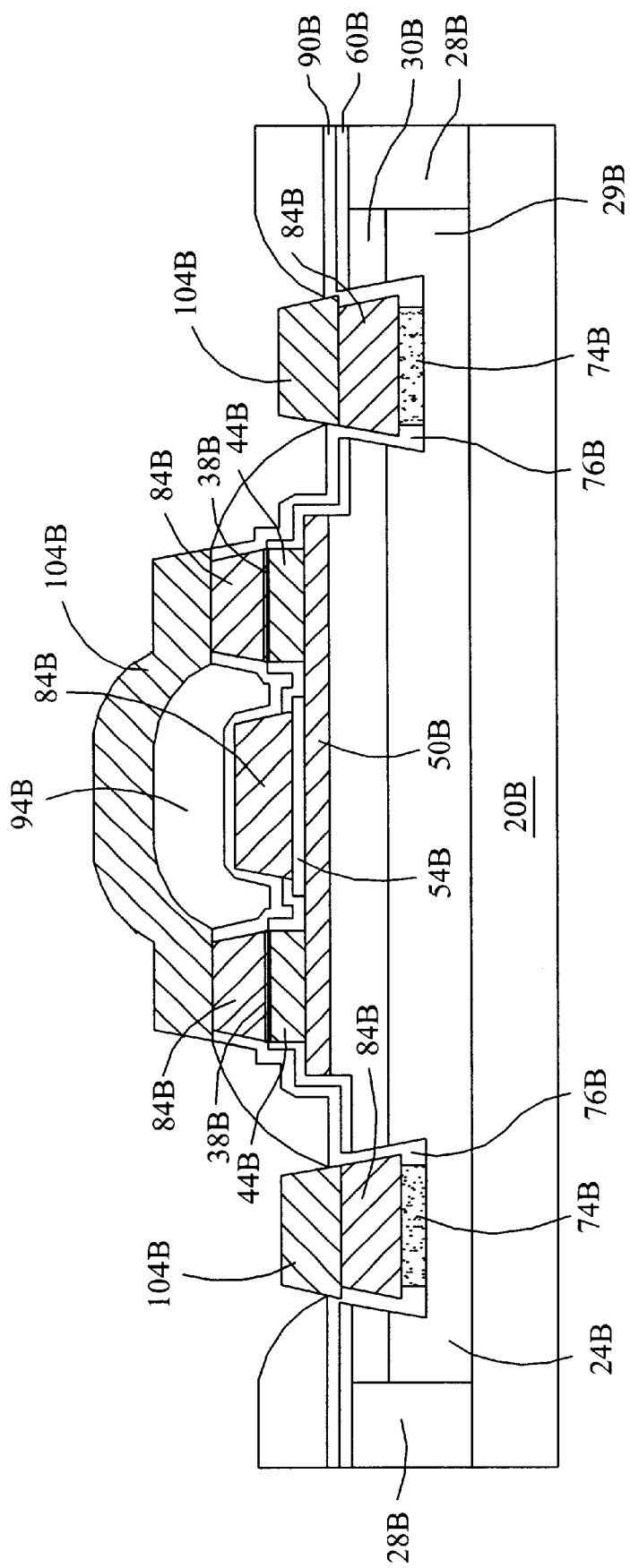
FIG. 6B is a cross-sectional view of a first section of the transistor of FIG. 6A through line 6B—6B (Sec. 6B).
Figure 6C:
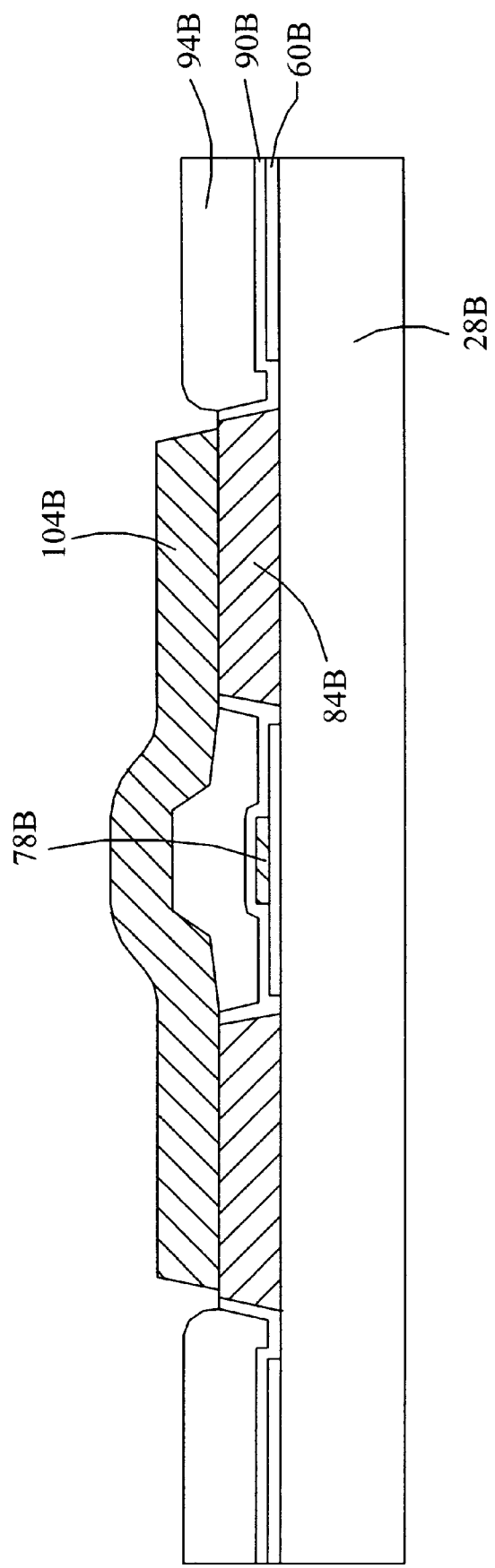
FIG. 6C is a cross-sectional view of a second section of the transistor of FIG. 6A through line 6C—6C (Sec. 6C).
Figure 6D:
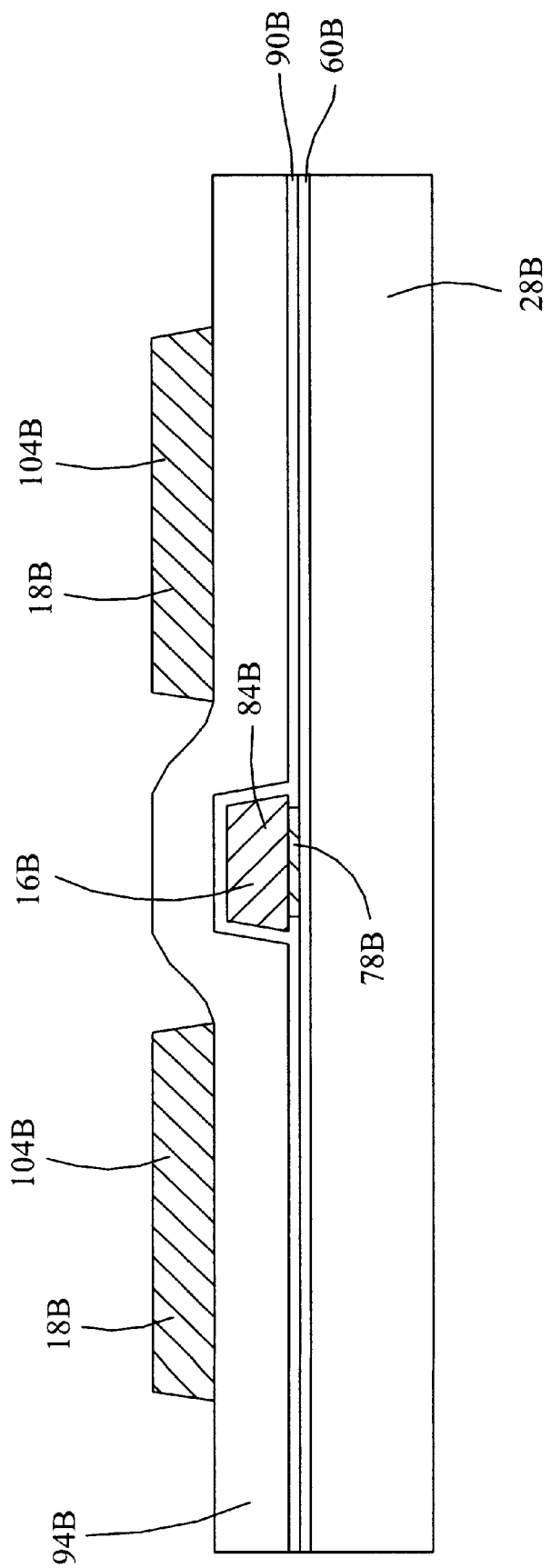
FIG. 6D is a cross-sectional view of a third section of the transistor of FIG. 6A through line 6D—6D (Sec. 6D).
Figure 6E:
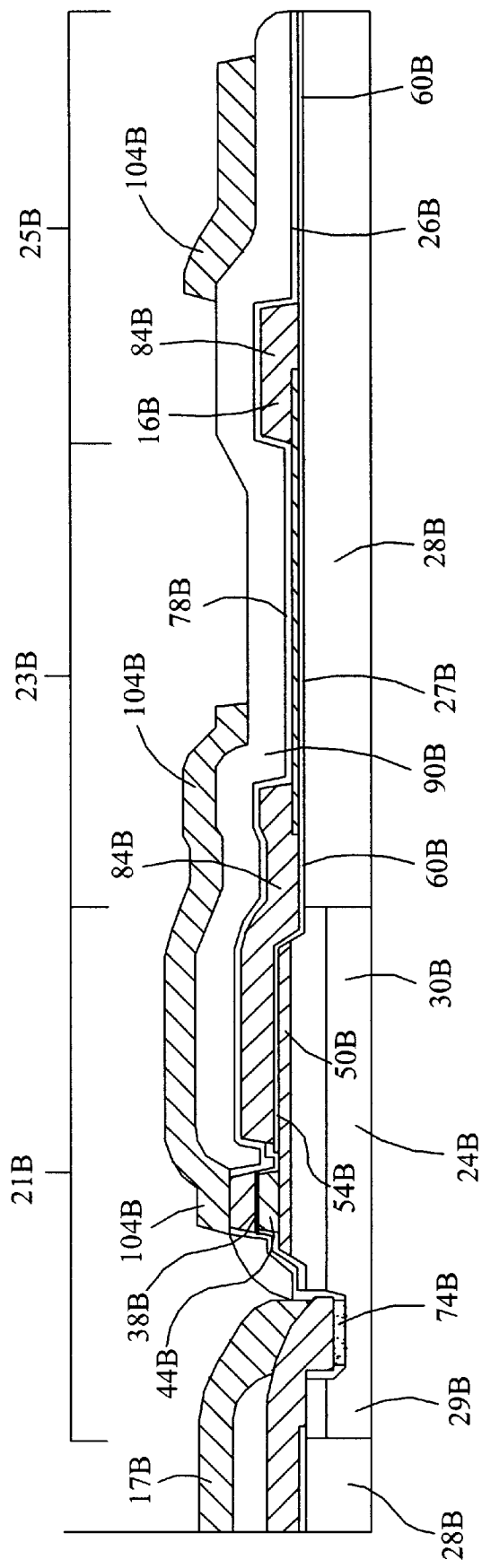
FIG. 6E is a cross-sectional view of the transistor of FIG. 6A through line 6E—6E (Sec. 6E).
Figure 8:
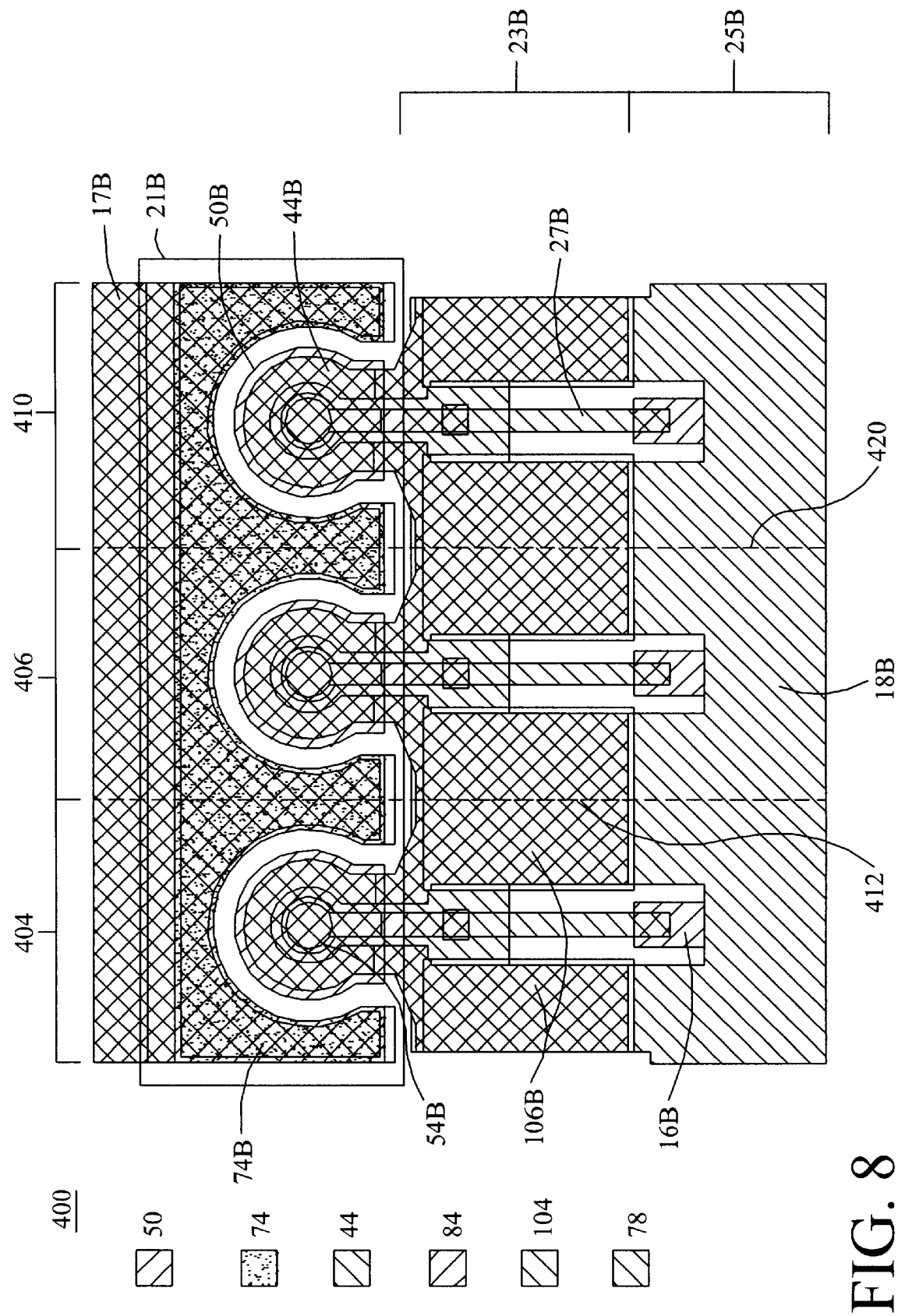
FIG. 8 is a top plan view of a block of transistors that are configured in accordance with the third embodiment of the present invention.

FIGS. 6A–6I and 8 illustrate a transistor 19B configured in accordance with a heat shunting embodiment of the present invention where each transistor cell 19B does not have an emitter ballast resistor. FIG. 6A illustrates a top plan view. FIGS. 6B–6E illustrate selected views through cross sections of FIG. 6A. FIGS. 6F–6K illustrate top plan views of selected layers of transistor 19B of this embodiment. FIG. 8 is a top plan view of a block 400 of transistor cells (e.g., 404, 406 and 410) configured in accordance with the third embodiment of the present invention.

In applications where an emitter ballast resistor is not needed, more than one transistor cell can be coupled together so that the temperature across the transistor cells (e.g., 404, 406 and 410) can be distributed more evenly. This embodiment provides improved thermal management across an array or block of transistor cells (e.g., 404, 406 and 410). This embodiment provides good averaging of thermal patterns across blocks of transistor cells (e.g., 404, 406 and 410).

In this embodiment, the intrinsic section 21B and the second section 23B remain essentially the same as the intrinsic section 21A and the second section 23A of the second embodiment. The third section 25B is referred to in this embodiment as the "emitter terminal" section 25B because there is no emitter ballast resistor.

Figure 6F:
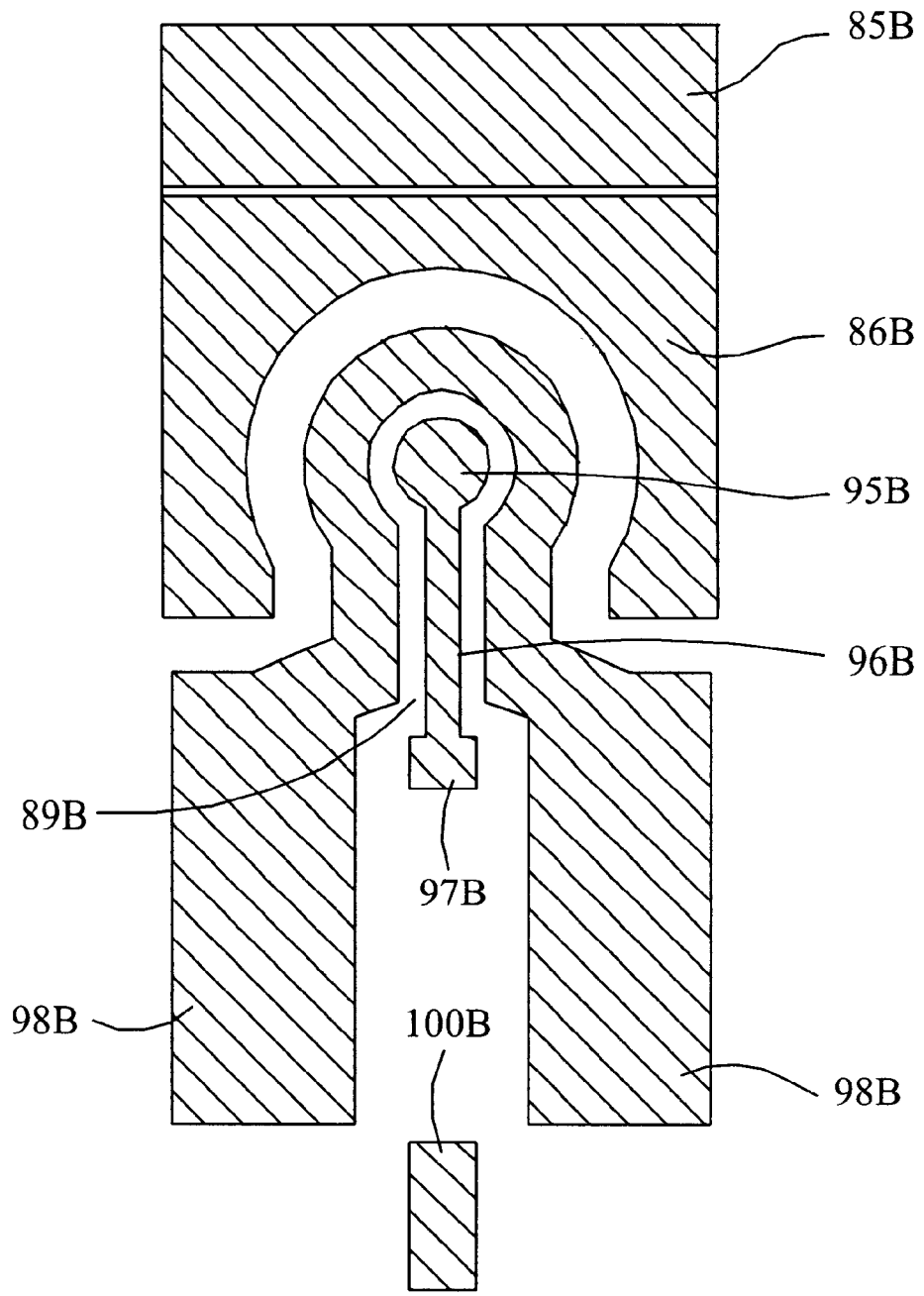
FIGS. 6F–6K are top views of selected layers in the transistor of FIG. 6A.
Figure 6G:
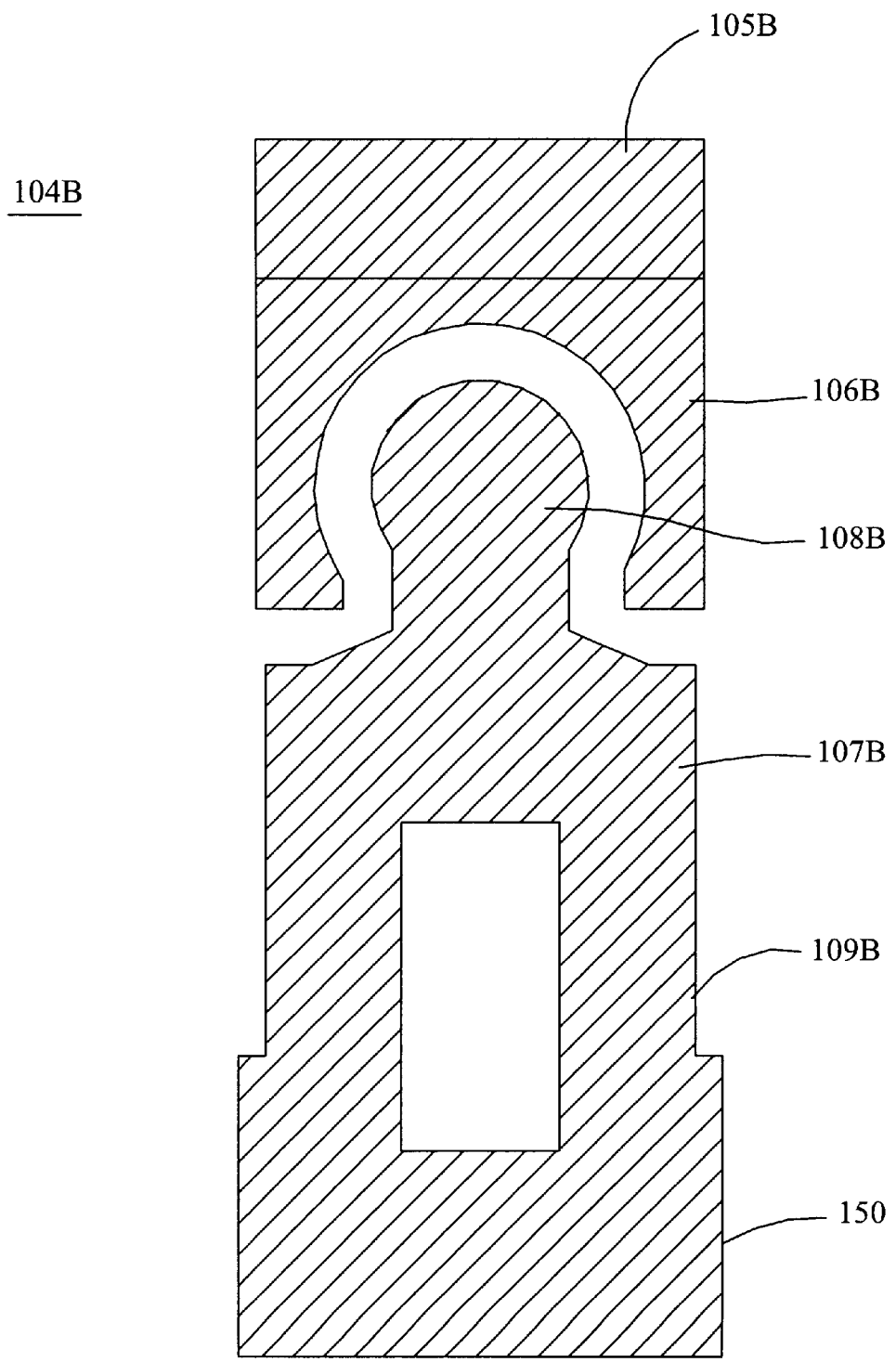
Figure 6H:
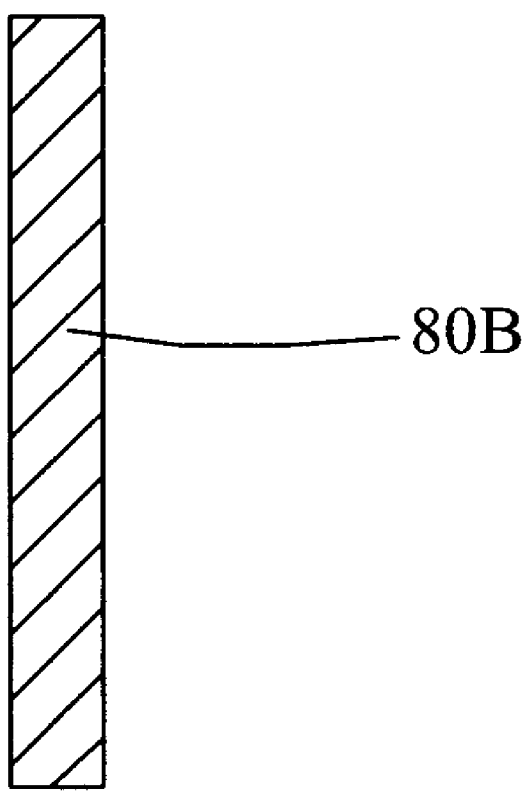
Figure 6I:
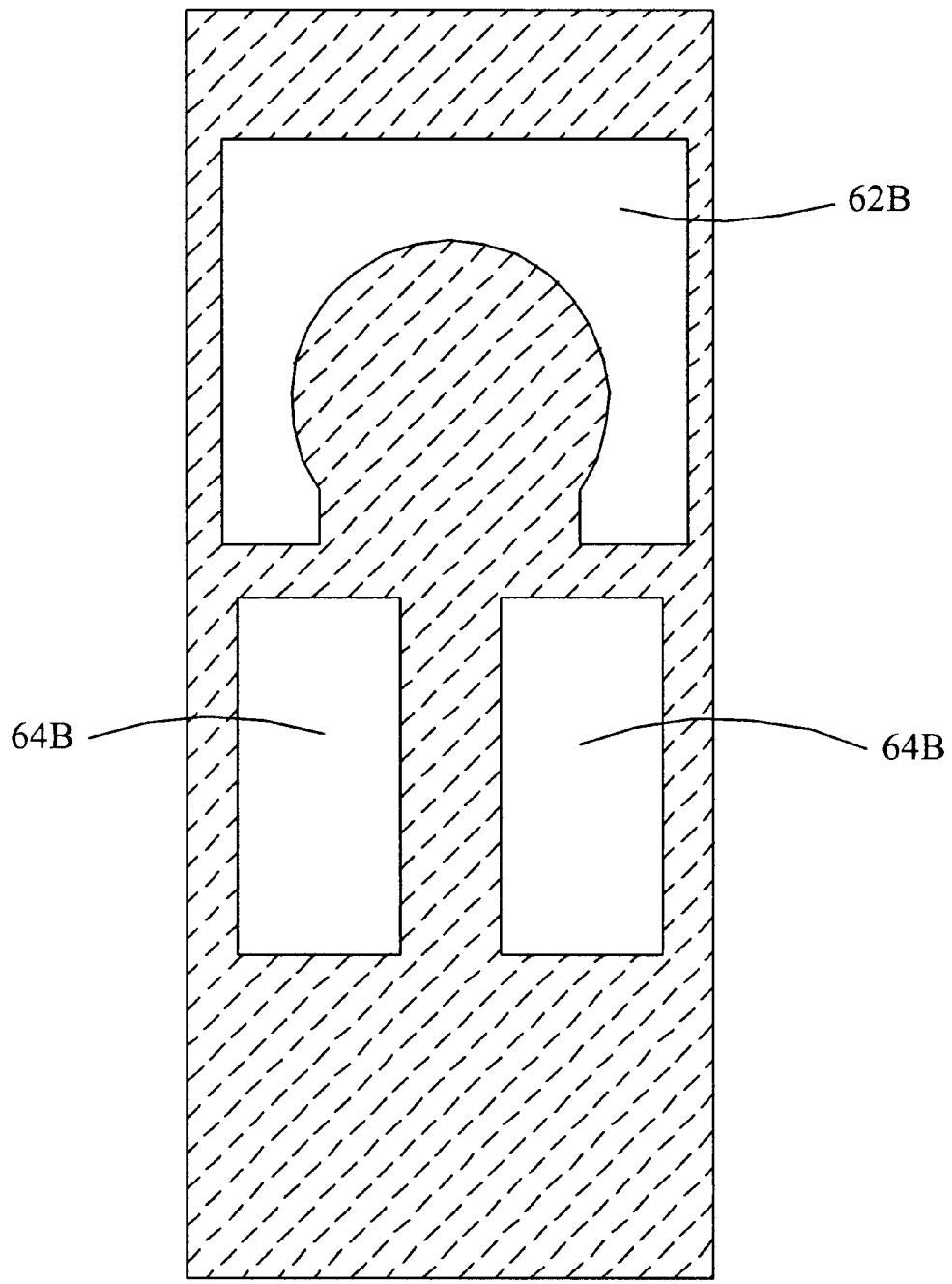
Figure 6J:
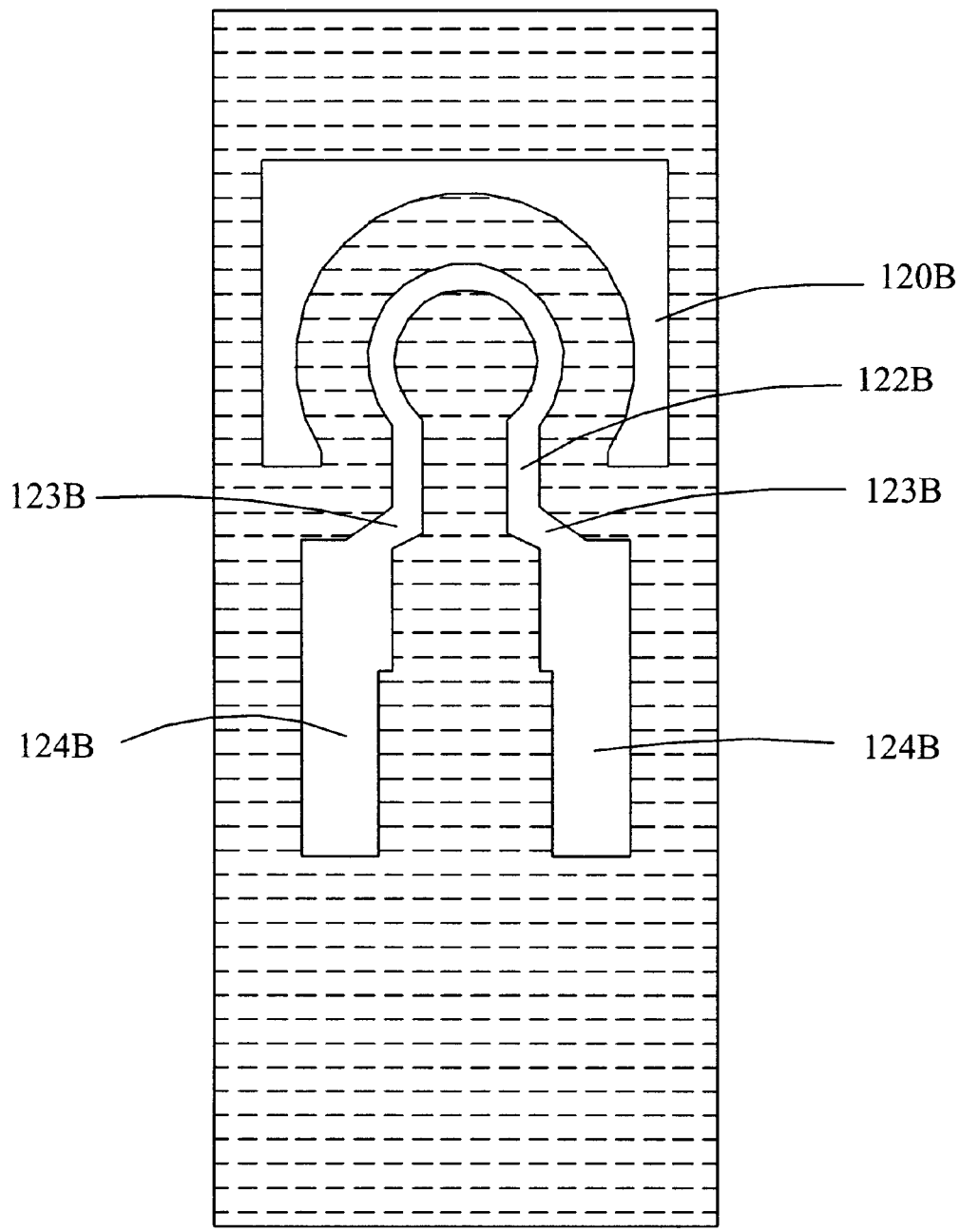
Figure 6K:
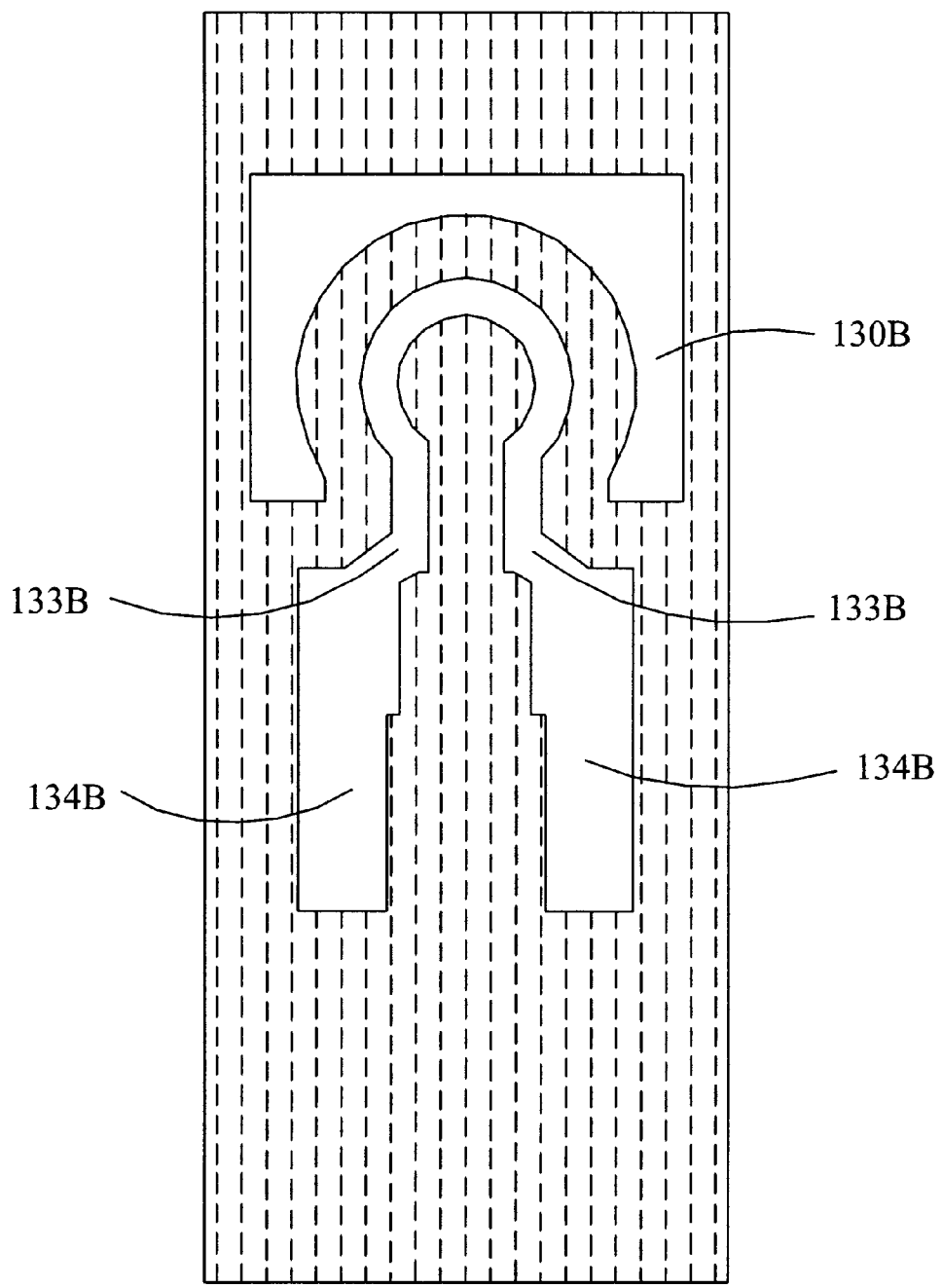

Comparing FIGS. 5F and 6F, portion 98B are wider than portion 98A of the second embodiment for heat shunting across transistor cells (e.g., 404, 406 and 410) and does not extend into third section 25B. Referring to FIG. 6G, an additional portion 150 is added in third section 25B for heat shunting across transistor cells. Referring to FIGS. 6J and 6K, windows 124B and 134B in the second dielectric layer 90B and third thick dielectric layer 94B, respectively, do not extend into third section 25B.

Referring to FIG. 8, in second section 23B, portion 98B of first metal layer 84B and portion 150 of second metal layer 104B are coupled across adjacent transistor cells at junctions 412 and 420. In third section 25B, second metal layer 104B is coupled across adjacent transistors at junctions 412 and 420. Since no emitter ballast resistor is included in this embodiment, there is no space or gap between the metal layers in the second section 23B as in the second embodiment.

Figure 1:
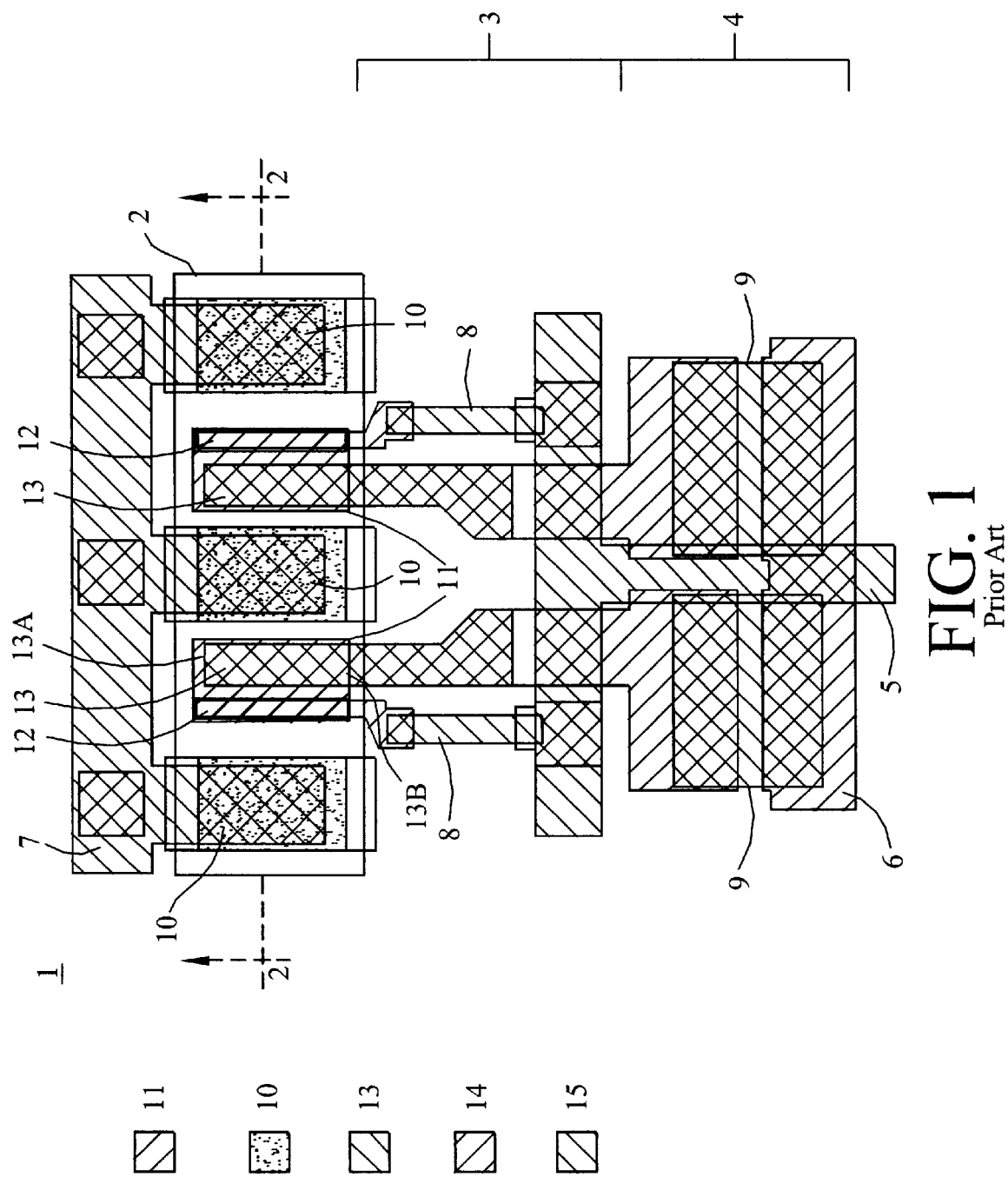
FIG. 1 is a top view of a layout of a conventional power transistor.
Figure 2:
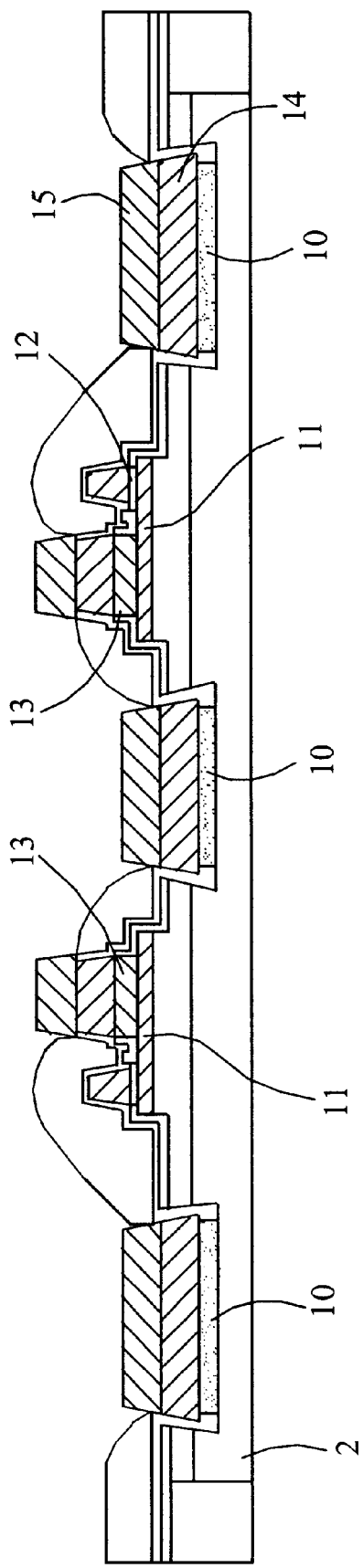
FIG. 2 is a cross-sectional view of the conventional transistor of FIG. 1 through line 2—2 (Sec. 2) thereof.

The heat shunting configurations, taught by the second and third embodiment of the present invention, are low cost and do not require through-substrate vias, which increase manufacturing costs. Moreover, the heat shunting configurations can be employed with conventional layouts of the intrinsic transistor (e.g., the rectangular intrinsic transistor layout illustrated in FIGS. 1 and 2) and is not limited to being used in conjunction with the novel layout of the transistor of the present invention.

The transistor 19 of the present invention can be a power transistor adapted for use in power amplifiers. The transistor can be operated in the common-emitter mode, the common-base mode and the common collector mode. In power amplifier applications, the common-emitter mode, where the emitter is coupled to ground and the base electrode receives the input signal, is preferred because the common-emitter configuration provides good gain and RF stability at lower frequencies. Moreover, this configuration provides better reverse isolation than other configurations.

Also, in power amplifier applications, an NPN type transistor is preferred. However, it will be understood by those of ordinary skill in the art that other types of configurations, such as PNP, may be more suitable for other applications. Furthermore, the teachings of the present invention are not confined to HBT GaAs technology, but would extend to cover to other processing technologies such as silicon processing.

The compact, novel layout for the transistor 19 of the present invention can be employed in power amplifiers for a wide number of both analog and digital cellular applications. These applications can include different technologies, such as Advanced Mobile Phone Service (AMPS), Code Division, Multiple Access (CDMA), Digital Cellular System (DCS), Global System for Mobile-Communications (GSM), Time Division, Multiple Access (TDMA), and Personal Communications Services (PCS) for a 3V power supply and the corresponding technologies that use a 5V power supply. For example, power transistors having the compact and novel layout of the present invention can be advantageously used in single band and dual band digital cellular telephones.

The novel power transistor 19 of the present invention provides one or more of the following advantages: 1) reduced layout area (compact layout); 2) improved electrical performance; 3) improved reliability and performance; and 4) suitable for low operating voltages.

REDUCED LAYOUT AREA

The novel layout and configuration of the transistor 19 of the present invention reduces the layout area occupied by the transistor. Consequently, the costs to manufacture the device are decreased while the level of integration is increased. For example, the compact layout of the transistor 19 of the present invention occupies approximately one-half of the area of conventional transistors while offering the same emitter area and resulting emitter current density output.

IMPROVED ELECTRICAL PERFORMANCE

The reduced base pedestal 50 area of the improved power transistor of the present invention translates into a smaller base-to-collector capacitance, thereby increasing performance of the transistor 19. Furthermore, the present invention employs the emitter 44 to isolate the collector contact 74 from base contact 54. This isolation further reduces the base-to-collector capacitance, which in turn improves the electrical performance of the transistor 19, and the over-all circuit employing the transistor 19. For example, the gain of the improved transistor 19 is higher; the efficiency of the transistor 19 is higher, and the feedback capacitance is lower than conventional HBT devices, thereby improving radio frequency (RF) stability.

INCREASED RELIABILITY

Since each emitter 44 provides more than one feed point, and current is drawn through both feed points, current distribution and current density in the emitter 44 is more even than compared to conventional transistor layouts that use an emitter with a single feed point to draw current from the emitter. A more even and uniform current density decreases the likelihood of device failure via emitter burn-out.

SUITABLE FOR LOW OPERATING VOLTAGES

The transistor 19 of the present invention features a low collector-to-emitter resistance by allowing current to flow radially from the collector contact 74 to emitter 44. A low collector-to-emitter resistance is important for low voltage applications because low voltage applications are more sensitive to resistive losses, such as losses due to the collector-to-emitter resistance.

Accordingly, a transistor 19 with a novel layout that occupies less area, is suitable for low operating voltages, improves performance and increases the reliability of the transistor has been described.

It will be recognized that the above described invention may be embodied in other specific forms without departing from the spirit or essential characteristics of the disclosure. Thus, it is understood that the invention is not to be limited by the foregoing illustrative details, but rather is to be defined by the appended claims.

What is claimed is:

1. A transistor having a base terminal, an emitter terminal, and a collector terminal, said transistor comprising:
    (a) a sub-collector layer;
    (b) a collector layer disposed on the sub-collector layer;
    (c) a base pedestal disposed on the collector layer;
    (d) a base contact disposed on the base pedestal for coupling to the base terminal;
    (e) an emitter disposed on the base pedestal, the emitter having a layout including a generally curved portion;
    (f) an emitter contact disposed on the emitter for coupling to the emitter terminal;
    (g) a trench formed in the sub-collector layer and the collector layer;
    (h) a collector contact having an interior portion deposited in the trench and disposed on the sub-collector layer for coupling to the collector terminal, wherein the collector contact interior portion is exterior to the emitter;
    (i) an inactive region;
    (j) a first dielectric layer disposed on the inactive region, said first dielectric layer defining a window;
    (k) a first metal layer having a first portion disposed on the emitter and a second portion disposed on the inactive region for coupling to the inactive region through the window; and
    (l) a second metal layer having a first portion for coupling to the first portion of the first metal layer and a second portion for coupling to the second portion of the first metal layer; wherein the first portion of the first metal layer, the first portion of the second metal layer, the second portion of the second metal layer, and the second portion of the first metal layer are configured to shunt heat from the emitter to the inactive region.

2. The transistor of claim 1, wherein said curved portion includes a generally ring-shape portion.

3. The transistor of claim 1, wherein said base pedestal includes a non-rectangular layout, said layout defining a curved portion and said base contact includes a layout having a curved portion.

4. The transistor of claim 1, wherein said base pedestal defines a first surface and said collector contact defines a first surface that is substantially parallel to the first surface of the base pedestal.

5. The transistor of claim 1, wherein the emitter further includes a first end and a second end; wherein current is drawn from both the first end and the second end.

6. The transistor of claim 1, wherein the second metal layer includes a third portion configured to further distribute heat in the transistor.

7. The transistor of claim 1, further comprising a base ballast resistor.

8. The transitor of claim 1, wherein the emitter has a track including an exterior portion, and the collector contact interior portion is formed about the exterior portion of the emitter track.

9. The transistor of claim 8 wherein the track is open.

10. The transistor of claim 8 wherein the track is closed.

11. The transistor of claim 8, wherein the track has a layout with a rectangular portion.

12. The transistor of claim 8, wherein the track has a layout with a non-rectangular portion.

13. The transistor of claim 8, wherein the track has a layout with a curved portion.

14. The transistor of claim 8, wherein the track has one of a ring-shape, U-shape, rectangular, and polygon-shape layout.

* * * * *